United States Patent
Okaguchi

(10) Patent No.: US 11,098,705 B2
(45) Date of Patent: Aug. 24, 2021

(54) PIEZOELECTRIC ELEMENT DRIVE CIRCUIT

(71) Applicant: Murata Manufacturing Co., Ltd., Kyoto (JP)

(72) Inventor: Kenjiro Okaguchi, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 439 days.

(21) Appl. No.: 16/173,029

(22) Filed: Oct. 29, 2018

(65) Prior Publication Data

US 2019/0067555 A1 Feb. 28, 2019

Related U.S. Application Data

(63) Continuation of application No. PCT/JP2017/017236, filed on May 2, 2017.

(30) Foreign Application Priority Data

May 11, 2016 (JP) .............................. JP2016-094964

(51) Int. Cl.
*H01L 41/09* (2006.01)
*F04B 43/04* (2006.01)
(Continued)

(52) U.S. Cl.
CPC .......... *F04B 43/046* (2013.01); *F04B 17/003* (2013.01); *F04B 49/06* (2013.01);
(Continued)

(58) Field of Classification Search
CPC ......... H01L 41/042; H02N 2/06; H02N 2/001
(Continued)

(56) References Cited

U.S. PATENT DOCUMENTS

2002/0096970 A1  6/2002  Hayashi et al.
2008/0179992 A1*  7/2008  Noda ........................ G03B 5/00
310/317
(Continued)

FOREIGN PATENT DOCUMENTS

JP    S55-144297 A    11/1980
JP    S58-198173 A    11/1983
(Continued)

OTHER PUBLICATIONS

International Search Report for International Application No. PCT/JP2017/017236 dated Aug. 1, 2017.
(Continued)

*Primary Examiner* — Derek J Rosenau
(74) *Attorney, Agent, or Firm* — Pearne & Gordon LLP

(57) ABSTRACT

A piezoelectric element drive circuit includes a piezoelectric element driven at a predetermined frequency and having a resonant frequency of (2n+1) times the predetermined frequency (n is a predetermined natural number), and a drive voltage generator that has a first output terminal connected to a first terminal of the piezoelectric element and a second output terminal connected to a second terminal of the piezoelectric element. When the piezoelectric element is driven, a waveform of potential difference between the first output terminal and the second output terminal is a step wave which transitions while taking an intermediate potential. A time length for which the potential difference is the intermediate potential is around $(t_2-t_1)/(2n+1)$ in a period of time from time $t_1$ at which the potential difference falls to the intermediate potential to time $t_2$ at which the potential difference falls to the intermediate potential subsequently.

13 Claims, 19 Drawing Sheets

(51) Int. Cl.
*F04B 49/06* (2006.01)
*H02N 2/06* (2006.01)
*F04B 17/00* (2006.01)
*H01L 41/04* (2006.01)
*H01L 41/113* (2006.01)

(52) U.S. Cl.
CPC .......... *F04B 49/065* (2013.01); *H01L 41/042* (2013.01); *H01L 41/09* (2013.01); *H01L 41/113* (2013.01); *H02N 2/06* (2013.01)

(58) Field of Classification Search
USPC ........................................................ 310/317
See application file for complete search history.

(56) References Cited

U.S. PATENT DOCUMENTS

| | | |
|---|---|---|
| 2014/0285065 A1 | 9/2014 | Okaguchi |
| 2016/0268928 A1 | 9/2016 | Goto et al. |
| 2017/0126148 A1 | 5/2017 | Okaguchi |

FOREIGN PATENT DOCUMENTS

| | | |
|---|---|---|
| JP | H01-158810 A | 6/1989 |
| JP | 2000-184759 A | 6/2000 |
| JP | 2003-164172 A | 6/2003 |
| JP | 2003-189644 A | 7/2003 |
| JP | 4744636 B1 | 8/2011 |
| JP | 2011-199102 A | 10/2011 |
| JP | 2013-121308 A | 6/2013 |
| WO | 2013/084709 A1 | 6/2013 |
| WO | 2014096789 A2 | 6/2014 |
| WO | 2015/079736 A1 | 6/2015 |
| WO | 2016/009869 A1 | 1/2016 |

OTHER PUBLICATIONS

Written Opinion for International Application No. PCT/JP2017/017236 dated Aug. 1, 2017.

* cited by examiner

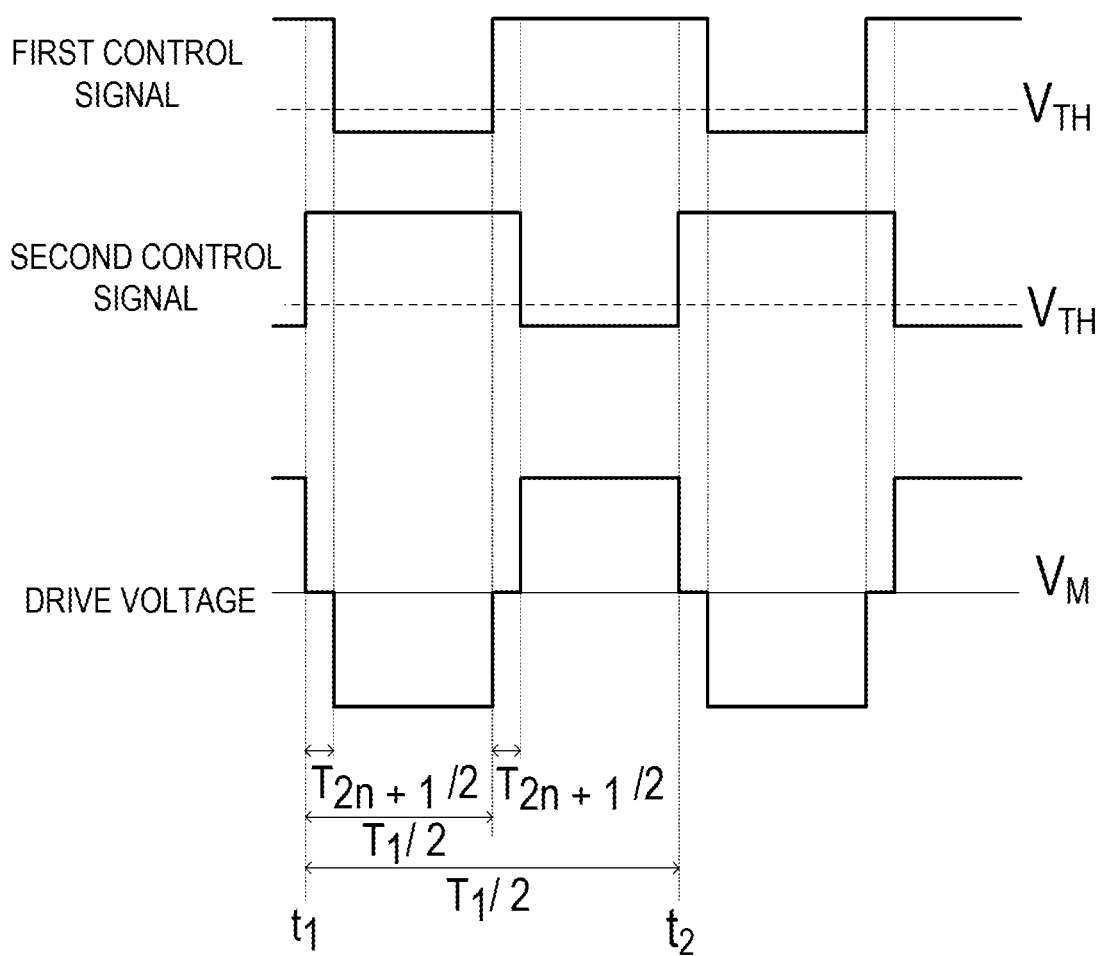

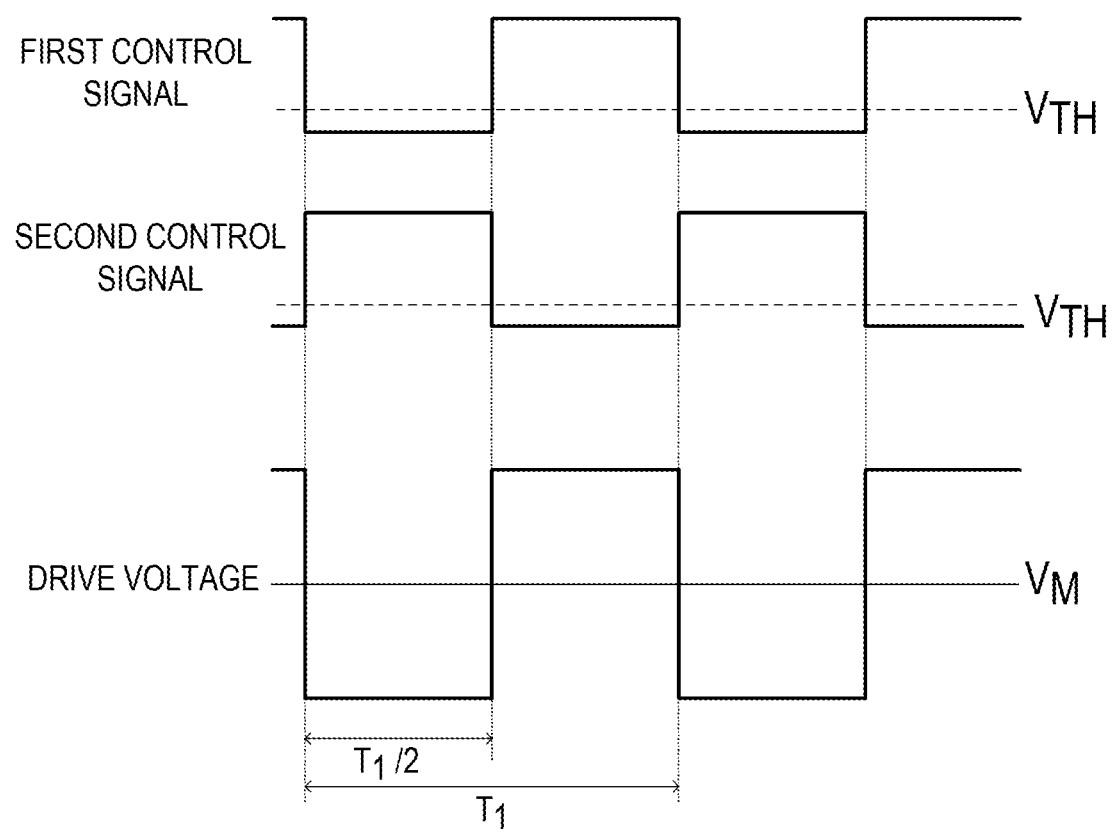

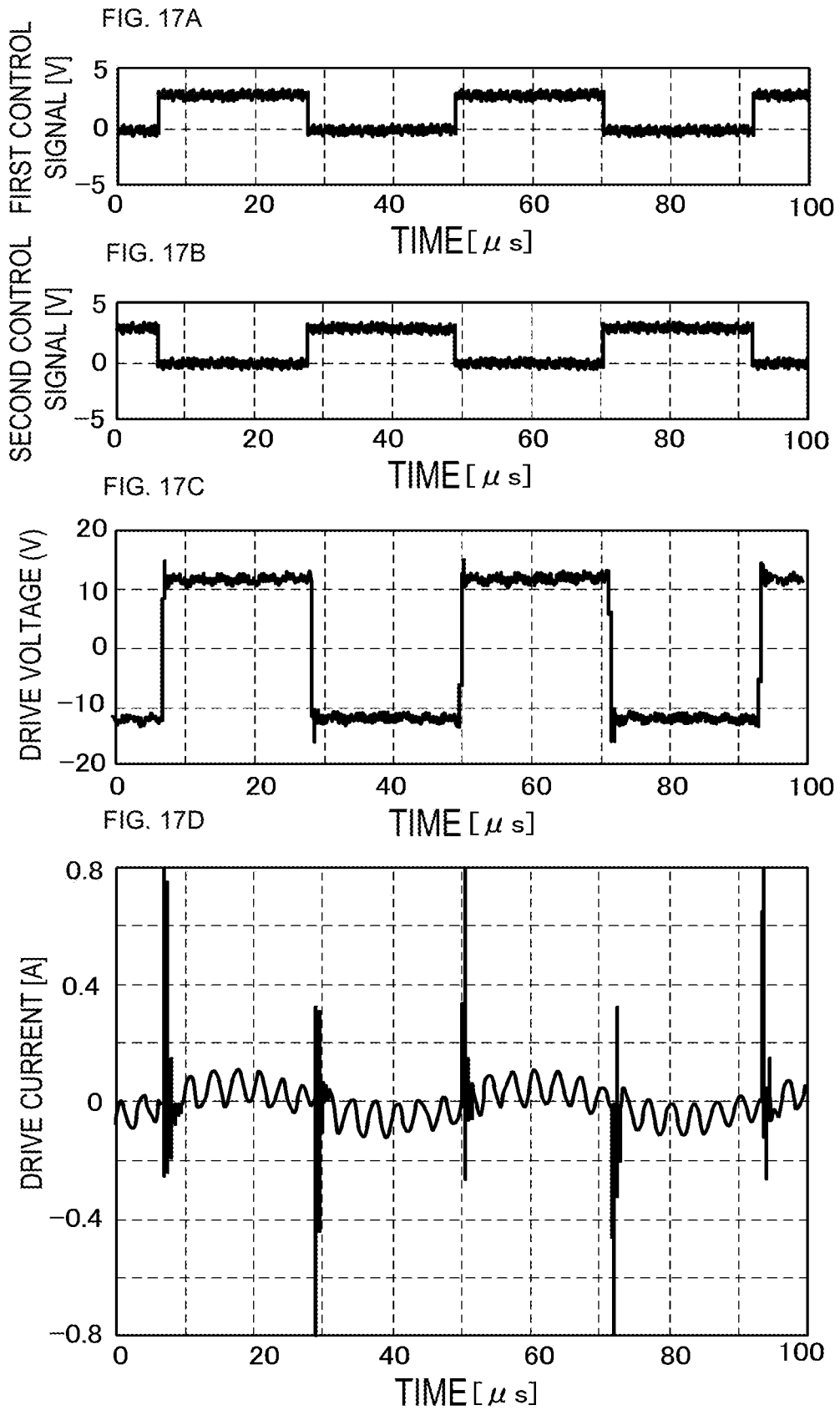

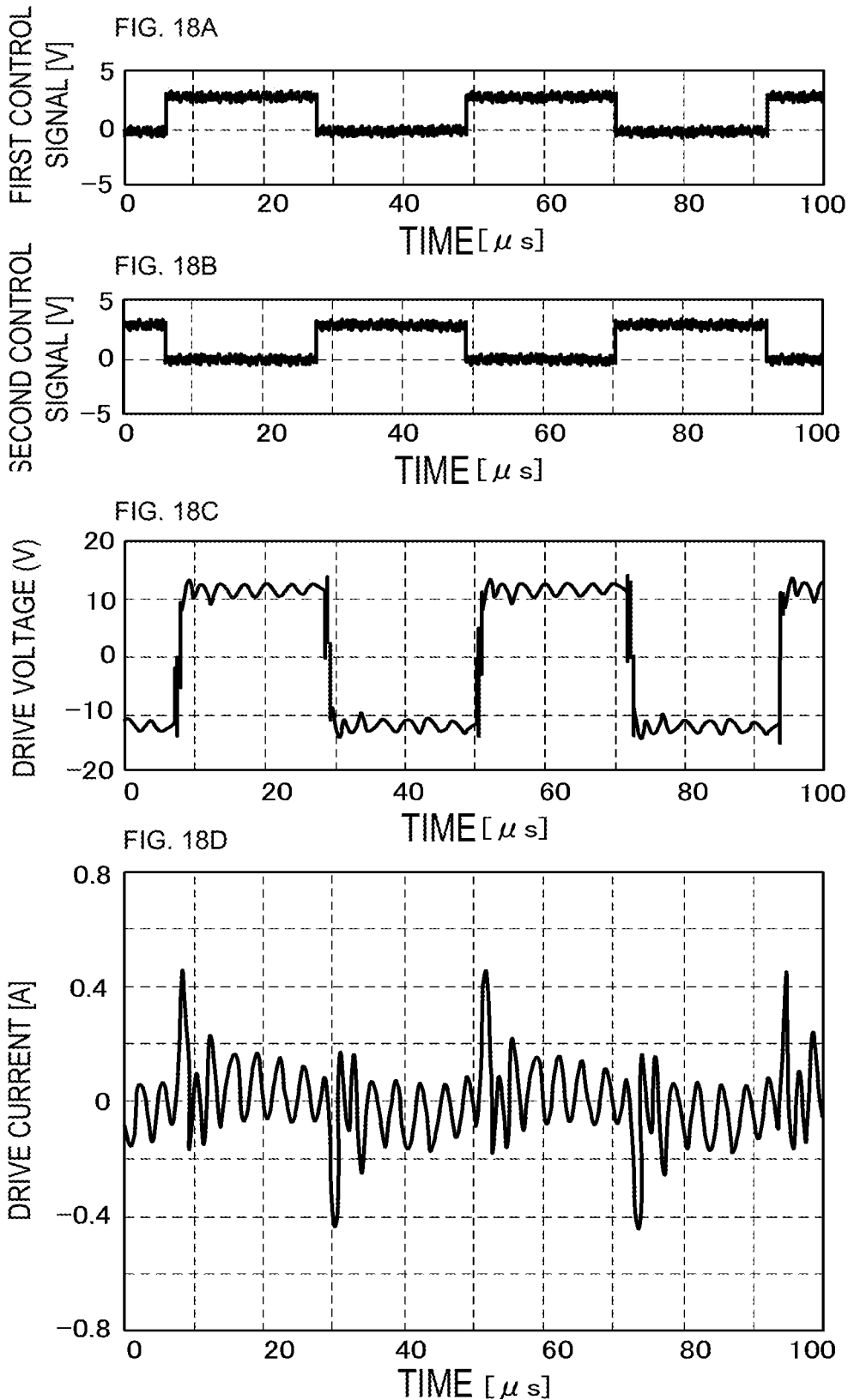

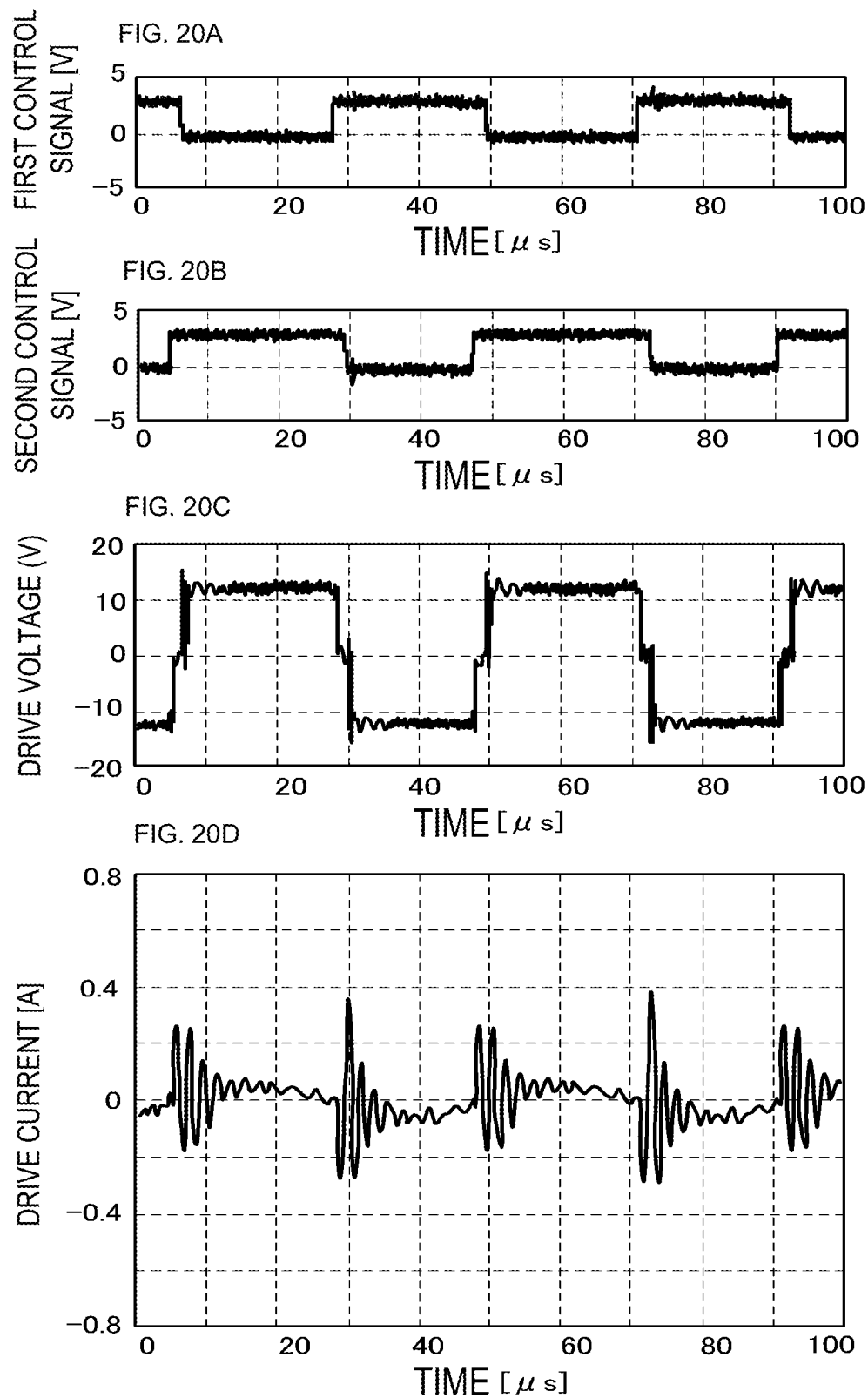

PIEZOELECTRIC ELEMENT DRIVE CIRCUIT

This is a continuation of International Application No. PCT/JP2017/017236 filed on May 2, 2017 which claims priority from Japanese Patent Application No. 2016-094964 filed on May 11, 2016. The contents of these applications are incorporated herein by reference in their entireties.

BACKGROUND OF THE DISCLOSURE

Field of the Disclosure

The present disclosure relates to a piezoelectric element drive circuit that drives a piezoelectric element.

Description of the Related Art

An existing piezoelectric element drive circuit is disclosed in, for example, Patent Document 1. The piezoelectric element drive circuit includes an H bridge circuit, a resistor, a differential amplifier circuit, an inverting circuit, a first comparator, and a second comparator. The H bridge circuit has a first input terminal and a second input terminal, and a first output terminal and a second output terminal that are respectively connected to both terminals of a piezoelectric element. The resistor is connected between the piezoelectric element and the first output terminal of the H bridge circuit. The differential amplifier circuit receives a voltage between both ends of the resistor as an input. An input terminal of the inverting circuit is connected to an output terminal of the differential amplifier circuit. An input terminal of the first comparator is connected to the input terminal of the inverting circuit. An output terminal of the first comparator is connected to the first input terminal of the H bridge circuit. An input terminal of the second comparator is connected to an output terminal of the inverting circuit. An output terminal of the second comparator is connected to the second input terminal of the H bridge circuit.

Patent Document 1: International Publication No. WO 2016/009869

BRIEF SUMMARY OF THE DISCLOSURE

In the piezoelectric element drive circuit described in Patent Document 1, since a drive voltage is a rectangular wave and is therefore lowered, power consumption during operation of the piezoelectric element is reduced. On the other hand, the drive voltage having the rectangular wave contains a harmonic that does not contribute to substantial operation of the piezoelectric element and only consumes power. Therefore, in this piezoelectric element drive circuit, power consumption cannot not be sufficiently reduced depending on factors other than the fact that the drive voltage is the rectangular wave.

It is an object of the present disclosure to provide a piezoelectric element drive circuit capable of reducing wasteful power consumption that does not contribute to substantial operation of a piezoelectric element.

A piezoelectric element drive circuit according to an aspect of the disclosure includes a piezoelectric element that is driven at a predetermined frequency and has a resonant frequency of (2n+1) times the predetermined frequency (n is a predetermined natural number), and a drive voltage generator that has a first output terminal which is connected to a first terminal of the piezoelectric element and a second output terminal which is connected to a second terminal of the piezoelectric element. When the piezoelectric element is driven, a waveform of the potential difference between the first output terminal and the second output terminal is a step wave which transitions while taking an intermediate potential. A time length for which the potential difference is the intermediate potential is around (t2−t1)/(2n+1) in a period of time from time t1 at which the potential difference falls to the intermediate potential to time t2 at which the potential difference falls to the intermediate potential subsequently.

When the piezoelectric element as described above is driven, a ripple due to a $(2n+1)^{th}$ order harmonic may appear in a drive current flowing between the first output terminal and the second output terminal. In the above configuration, since the $(2n+1)^{th}$ order harmonic of the drive current is suppressed, the ripple due to the $(2n+1)^{th}$ order harmonic is hardly generated in the drive current. Therefore, it is possible to reduce wasteful power consumption that does not contribute to substantial operation of the piezoelectric element as compared with the case where the ripple due to the $(2n+1)^{th}$ order harmonic appears in the drive current.

A height of a peak of an absolute value of an impedance of the piezoelectric element at the resonant frequency of (2n+1) times the predetermined frequency may be higher than a height of a peak of an absolute value of an impedance of the piezoelectric element at the predetermined frequency. In this configuration, the effect of reducing the wasteful power consumption that does not contribute to the substantial operation of the piezoelectric element is further enhanced.

A height of a peak of an absolute value of an impedance of the piezoelectric element at the resonant frequency of (2n+1) times the predetermined frequency may be the highest among peaks of absolute values of impedances of the piezoelectric element at resonant frequencies of the piezoelectric element. In this configuration, it is possible to further enhance the effect of reducing the wasteful power consumption that does not contribute to the substantial operation of the piezoelectric element.

The piezoelectric element drive circuit in the aspect of the disclosure may be configured as follows. A control signal generator that has a first control signal output terminal and a second control signal output terminal is provided. The drive voltage generator has a first input terminal connected to the first control signal output terminal and a second input terminal connected to the second control signal output terminal.

The piezoelectric element drive circuit in the aspect of the disclosure may include an inductor that is connected in series between the first output terminal and the first terminal of the piezoelectric element. In this configuration, a spike-like drive current that is generated when the potential difference (drive voltage) between the first output terminal and the second output terminal transitions is suppressed. Therefore, the wasteful power consumption that does not contribute to the substantial operation of the piezoelectric element can be reduced.

When the potential difference becomes the intermediate potential, the first output terminal and the second output terminal may be in open states when the drive voltage generator side is viewed from the piezoelectric element side.

When the potential difference becomes the intermediate potential, a voltage of 0 V may be applied between the first output terminal and the second output terminal.

According to the present disclosure, wasteful power consumption that does not contribute to substantial operation of a piezoelectric element can be reduced.

BRIEF DESCRIPTION OF THE SEVERAL VIEWS OF THE DRAWINGS

FIG. 3 is a schematic diagram illustrating waveforms of a first control signal, a second control signal, and a drive voltage according to the first and second examples of the first embodiment.

FIG. 4 is a schematic diagram illustrating waveforms of a first control signal, a second control signal, and a drive voltage according to a first comparative example and a second comparative example.

FIGS. 17A to 17D are diagrams illustrating waveforms of a first control signal, a second control signal, a drive voltage, and a drive current in a first comparative example, respectively.

FIGS. 18A to 18D are diagrams illustrating waveforms of a first control signal, a second control signal, a drive voltage, and a drive current in a second comparative example, respectively.

FIGS. 20A to 20D are diagrams illustrating waveforms of a first control signal, a second control signal, a drive voltage, and a drive current in a second example of the second embodiment, respectively.

DETAILED DESCRIPTION OF THE DISCLOSURE

Figure 1:
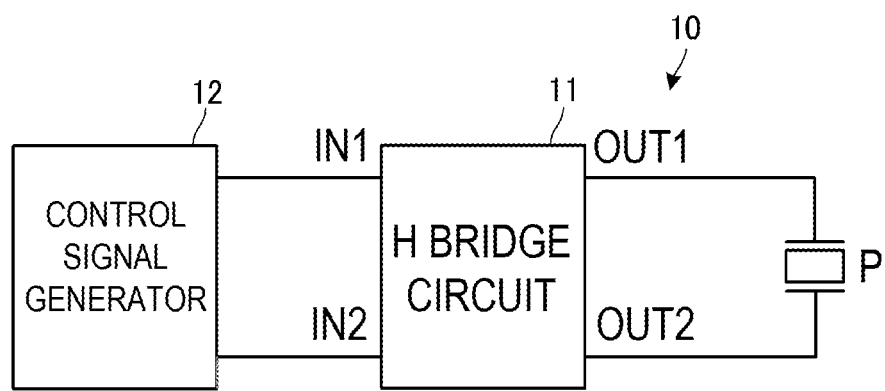
FIG. 1 is a block diagram of a piezoelectric element drive circuit 10 according to a first example of a first embodiment.

Hereinafter, a plurality of modes for carrying out the disclosure will be described using several specific examples with reference to the accompanying drawings. In the drawings, the same reference numerals denote the same parts. In view of the easiness of explanation or understanding of points of interest, embodiments are described separately for the convenience, but partial substitution or combination of configurations described in different embodiments is possible. In a second embodiment and subsequent embodiments, description of matters common to those in a first embodiment will be omitted, and only different points will be described. In particular, similar operational effects with similar configurations will not be described in each embodiment.

First Embodiment

FIG. 1 is a block diagram of a piezoelectric element drive circuit 10 according to a first example of a first embodiment. The piezoelectric element drive circuit 10 includes an H bridge circuit 11 and a control signal generator 12. The H bridge circuit 11 is an example of a "drive voltage generator" of the disclosure. The H bridge circuit 11 has a first input terminal IN1, a second input terminal IN2, a first output terminal OUT1, and a second output terminal OUT2. The control signal generator 12 has a first control signal output terminal and a second control signal output terminal. The first input terminal IN1 of the H bridge circuit 11 is connected to the first control signal output terminal of the control signal generator 12. The second input terminal IN2 of the H bridge circuit 11 is connected to the second control signal output terminal of the control signal generator 12. The first output terminal OUT1 of the H bridge circuit 11 is connected to a first terminal of a piezoelectric element P. The second output terminal OUT2 of the H bridge circuit 11 is connected to a second terminal of the piezoelectric element P. An absolute value of an impedance of the piezoelectric element P has a peak having the highest height at a $(2n+1)^{th}$ order resonant frequency of the piezoelectric element P among equal to or higher than secondary resonance frequencies of the piezoelectric element P. Here, n is a natural number. The peak height is the difference between a value at the top of the peak and a value at the skirt of the peak. The piezoelectric element P is used for, for example, a piezoelectric pump.

The control signal generator 12 outputs a first control signal from the first control signal output terminal, and outputs a second control signal from the second control signal output terminal. Frequencies of the first control signal and the second control signal are substantially equal to a fundamental resonant frequency of the piezoelectric element P. The first control signal is inputted to the first input terminal IN1 of the H bridge circuit 11. The second control signal is inputted to the second input terminal IN2 of the H bridge circuit 11. The H bridge circuit 11 drives the piezoelectric element P by changing states of the first output terminal and the second output terminal in response to the first control signal and the second control signal.

Figure 2:
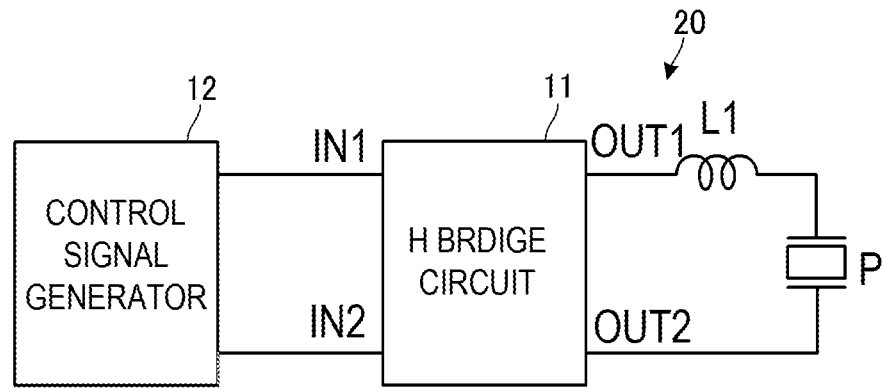
FIG. 2 is a block diagram of a piezoelectric element drive circuit 20 according to a second example of the first embodiment.
Figure 5A:
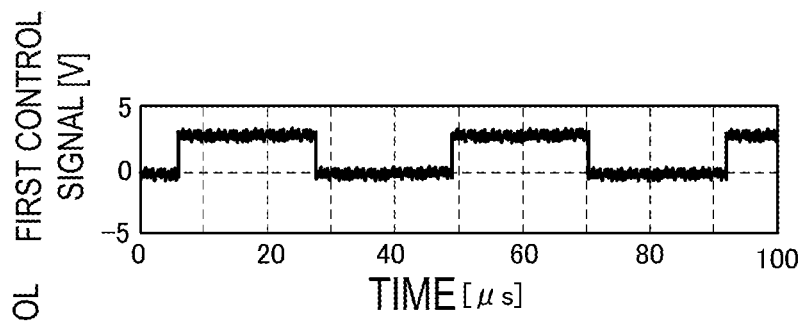
FIGS. 5A to 5D are diagrams illustrating waveforms of the first control signal, the second control signal, the drive voltage, and a drive current according to the first comparative example, respectively.
Figure 5B:
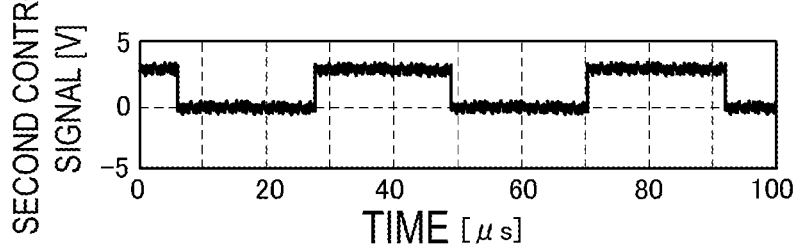
Figure 5C:
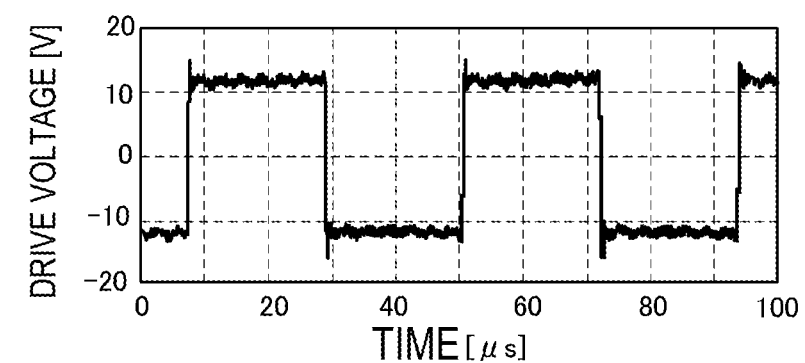
Figure 5D:
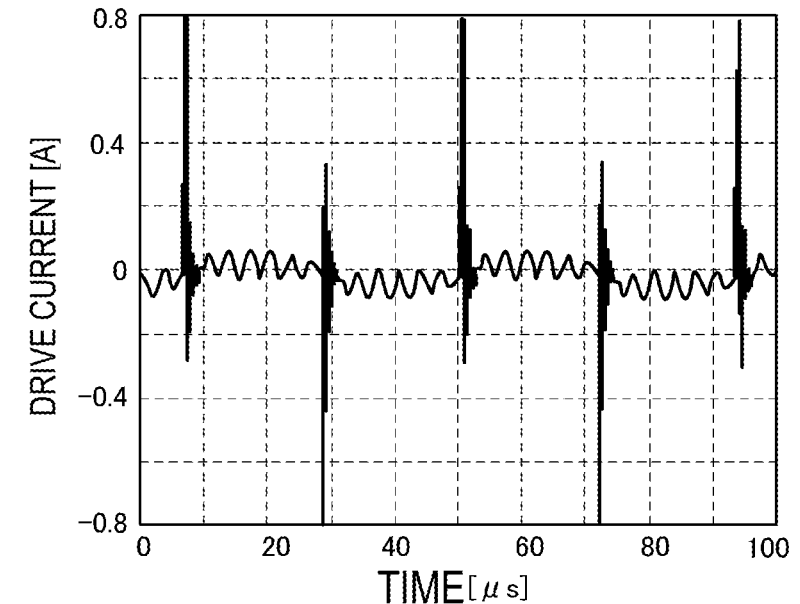
Figure 6A:
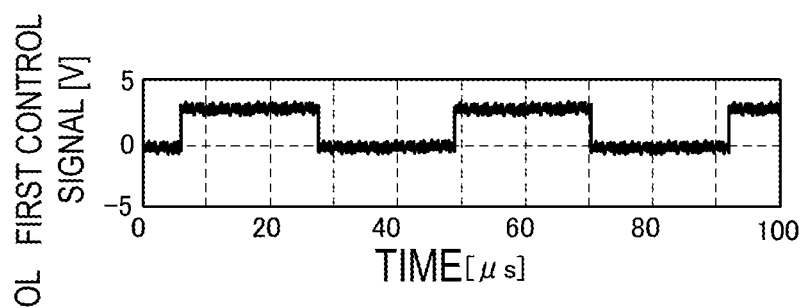
FIGS. 6A to 6D are diagrams illustrating waveforms of the first control signal, the second control signal, the drive voltage, and a drive current according to the second comparative example, respectively.
Figure 6B:
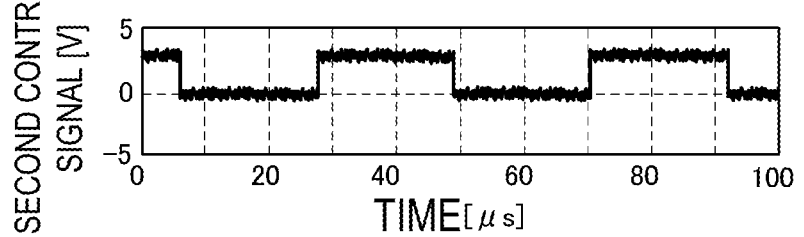
Figure 6C:
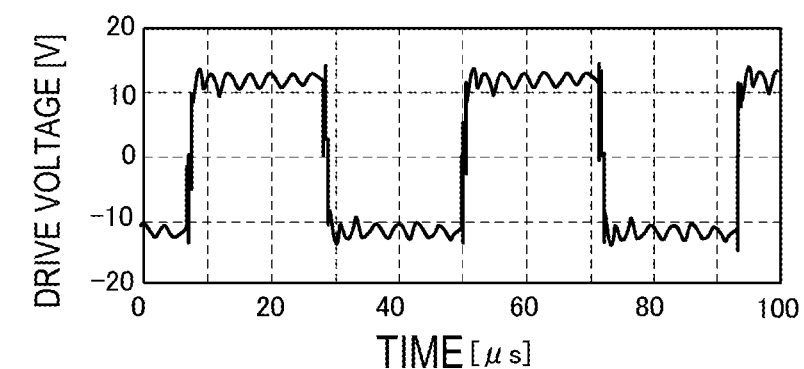
Figure 6D:
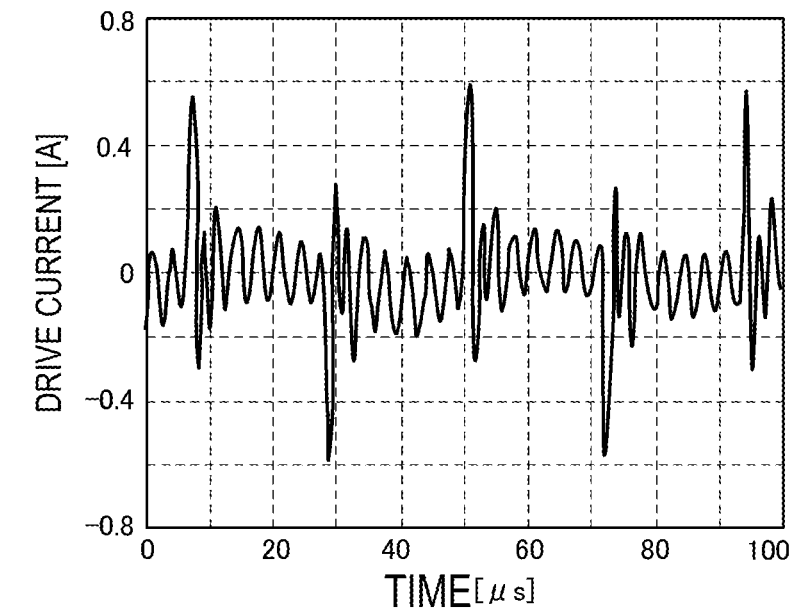
Figure 7A:
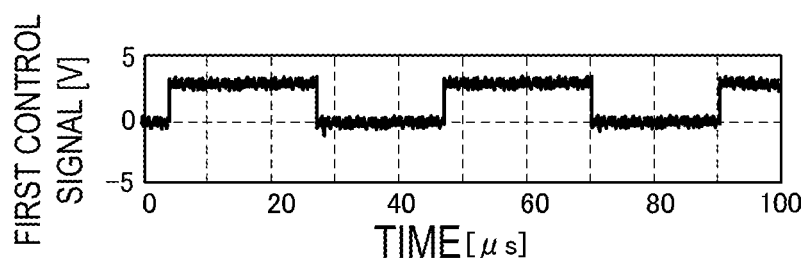
FIGS. 7A to 7D are diagrams illustrating waveforms of the first control signal, the second control signal, the drive voltage, and a drive current according to the first example of the first embodiment, respectively.
Figure 7B:
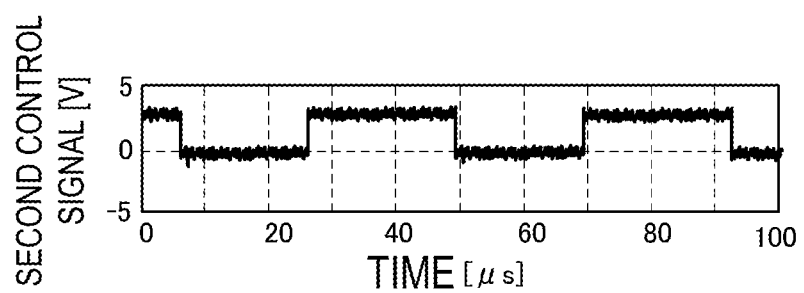
Figure 7C:
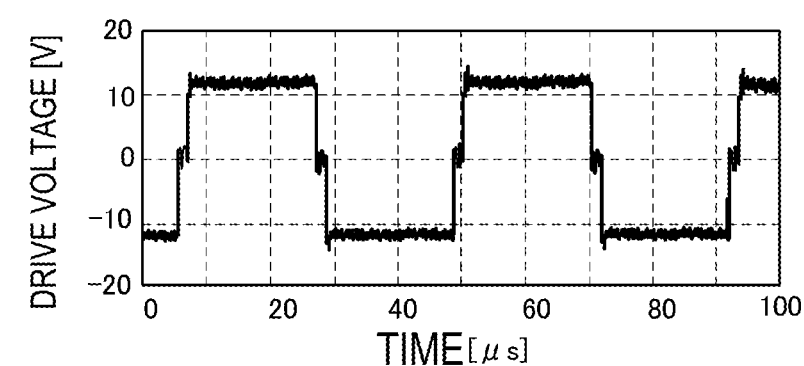
Figure 7D:
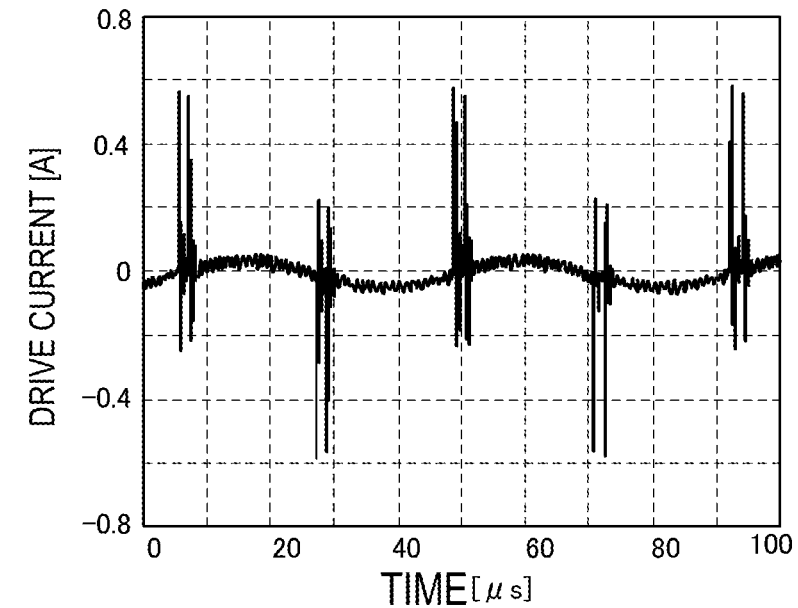
Figure 8A:
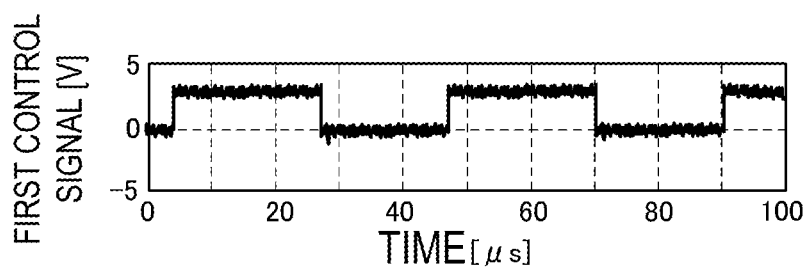
FIGS. 8A to 8D are diagrams illustrating waveforms of the first control signal, the second control signal, the drive voltage, and a drive current according to the second example of the first embodiment, respectively.
Figure 8B:
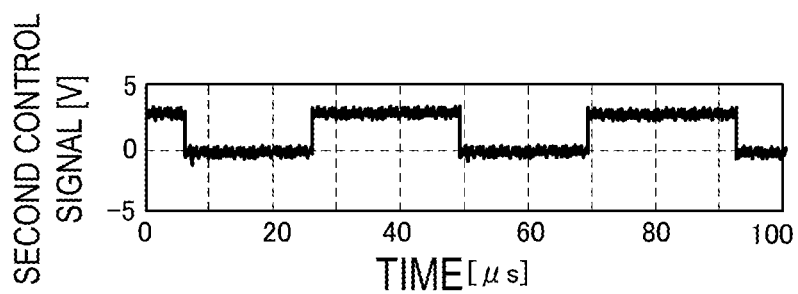
Figure 8C:
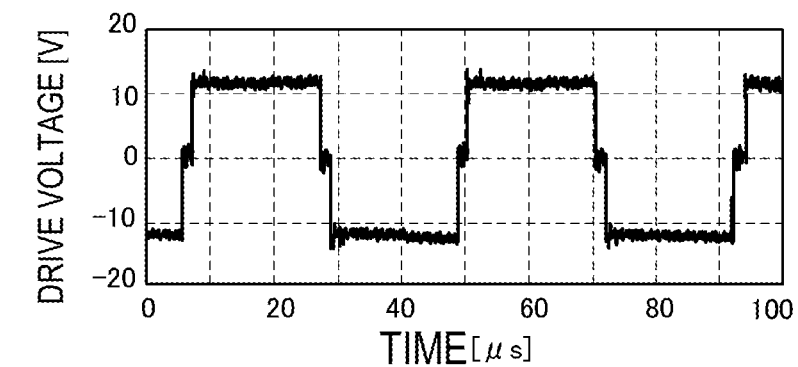
Figure 8D:
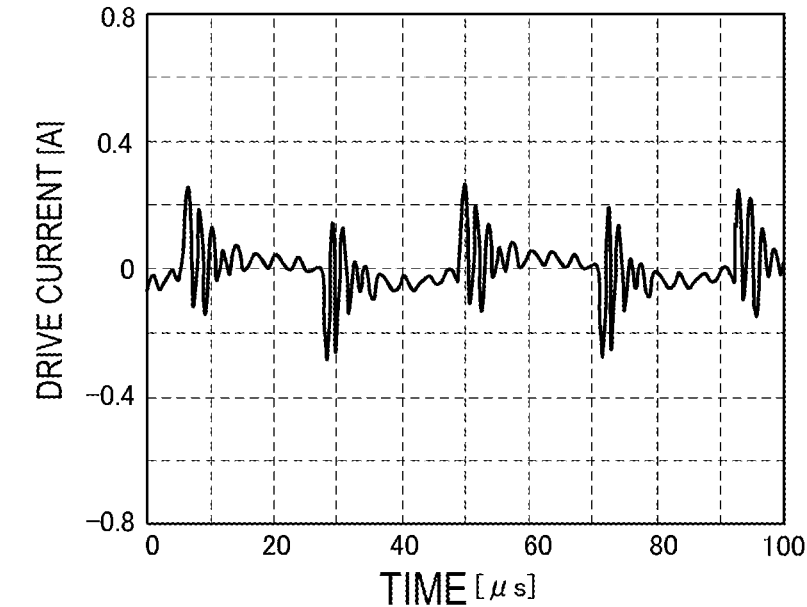

FIG. 2 is a block diagram of a piezoelectric element drive circuit 20 according to a second example of the first embodiment. The piezoelectric element drive circuit 20 includes an inductor L1 that is connected in series between the first output terminal OUT1 of the H bridge circuit 11 and the first terminal of the piezoelectric element P. Other configurations of the piezoelectric element drive circuit 20 are similar to those of the piezoelectric element drive circuit 10. Note that the inductor L1 may be connected in series between the second output terminal OUT2 of the H bridge circuit 11 and the second terminal of the piezoelectric element P.

FIG. 3 is a schematic diagram illustrating waveforms of the first control signal, the second control signal, and a drive voltage according to the first and second examples of the first embodiment. The drive voltage is the potential difference between the first output terminal OUT1 and the second output terminal OUT2 of the H bridge circuit 11. $V_M$ represents an intermediate potential and $V_{TH}$ represents a switching threshold value. The first control signal and the second control signal are rectangular waves each having a cycle $T_1$ and a duty ratio $(T_1+T_{2n-1})/2T_1$. Here, a period of time $T_{2n+1}=T_1/(2n+1)$ is satisfied. A phase of the second control signal and a phase of the first control signal are opposite to each other. A Hi-level potential of the first control signal and a Hi-level potential of the second control signal are equal to each other. A Low-level potential of the first control signal and a Low-level potential of the second control signal are equal to each other. The switching threshold value of the H bridge circuit 11 is set between the Hi-level of the first control signal and the Low-level of the first control signal.

When the potential of the first control signal is equal to or higher than the switching threshold value and the potential of the second control signal is lower than the switching threshold value, the H bridge circuit 11 sets the potential of the first output terminal OUT1 to the Hi-level and sets the potential of the second output terminal OUT2 to the Low-level. At this time, the drive voltage becomes a maximum value. When the potential of the first control signal is lower than the switching threshold value and the potential of the second control signal is equal to or higher than the switching threshold value, the H bridge circuit 11 sets the potential of the first output terminal OUT1 to the Low level and sets the potential of the second output terminal OUT2 to the Hi level. At this time, the drive voltage becomes a minimum value. Here, the Hi-level potential of the first output terminal OUT1 and the Hi-level potential of the second output terminal OUT2 are equal to each other. The Low-level potential of the first output terminal OUT1 and the Low-level potential of the second output terminal OUT2 are equal to each other.

When the levels of the first control signal and the second control signal are equal to or higher than the switching threshold value, the H bridge circuit 11 sets the first output terminal OUT1 and the second output terminal OUT2 to high impedance. In other words, when the potentials of the first control signal and the second control signal are equal to or higher than the switching threshold value, the first output terminal OUT1 and the second output terminal OUT2 are made into open states when the H bridge circuit 11 side is viewed from the piezoelectric element P side. At this time, the drive voltage becomes the intermediate potential. That is, when the drive voltage is the intermediate potential, the first output terminal OUT1 and the second output terminal OUT2 are in the open states when the H bridge circuit 11 side is viewed from the piezoelectric element P side.

Alternatively, when the potentials of the first control signal and the second control signal are equal to or higher than the switching threshold value, the H bridge circuit 11 may set both of the potentials of the first output terminal OUT1 and the second output terminal OUT2 to the Hi level or Low level. At this time, the drive voltage becomes the intermediate potential. That is, when the drive voltage is the intermediate potential, a voltage of 0 V is applied between the first output terminal OUT1 and the second output terminal OUT2.

Since the H bridge circuit 11 operates as described above, a waveform of the drive voltage becomes a step wave. That is, the drive voltage periodically repeats stepwise transition. In other words, the drive voltage periodically repeats changes with steep rise and fall. The drive voltage periodically repeats the step-like transition among the maximum value, minimum value and intermediate potential. In other words, the waveform of the drive voltage is the step wave which transitions while taking the intermediate potential when the piezoelectric element P is driven. The intermediate potential of the drive voltage is a potential located between the maximum value (maximum potential) of the drive voltage and the minimum value (minimum potential) of the drive voltage. In the first embodiment, the intermediate potential of the drive voltage is set to a potential which is equally separated from the maximum value of the drive voltage and the minimum value of the drive voltage, in other words, to a median value between the maximum value of the drive voltage and the minimum value of the drive voltage. A cycle of the drive voltage is $T_1$. A period of time $T_1$ is substantially equal to the reciprocal of the fundamental resonant frequency of the piezoelectric element P. An amplitude of the drive voltage is 2 times the potential difference between the potential of the maximum value of the first output terminal OUT1 and the potential of the minimum value of the second output terminal OUT2.

A time length for which the drive voltage is the intermediate potential (pause time) is $T_{2n+1}=T_1/(2n+1)$ per cycle. The period of time $T_{2n+1}$ is substantially equal to the reciprocal of the $(2n+1)^{th}$ order resonant frequency of the piezoelectric element P. The drive voltage falls from the maximum value to the intermediate potential at time $t_1$, and subsequently falls from the maximum value to the intermediate potential at time $t_2=t_1+T_1$. The pause time of the drive voltage is $(t_2-t_1)/(2n+1)$ between the time $t_1$ and the time $t_2$. The drive voltage is the intermediate potential for a period of time $T_{2n+1}/2$, is the minimum value for a subsequent period of time $(T_1-T_{2n+1})/2$, is the intermediate potential for a subsequent period of time $T_{2n-1}/2$, and is the maximum value for a subsequent period of time $(T_1-T_{2n+1})/2$. The drive voltage periodically repeats this step-like transition.

Next, a piezoelectric element drive circuit in a first comparative example will be described. The piezoelectric element drive circuit in the first comparative example is configured similarly to the piezoelectric element drive circuit 10 (see FIG. 1). A piezoelectric element drive circuit in a second comparative example is configured similarly to the piezoelectric element drive circuit 20 (see FIG. 2). FIG. 4 is a schematic diagram illustrating waveforms of a first control signal, a second control signal, and a drive voltage according to the first comparative example and the second comparative example. The first control signal and the second control signal are rectangular waves each having a cycle $T_1$ and a duty ratio 0.5. A phase of the second control signal and a phase of the first control signal are opposite to each other. The drive voltage is a rectangular wave having a duty ratio of 0.5. In the first comparative example and the second comparative example, a cycle, an amplitude, and an intermediate potential of the drive voltage are similar to those in the first and second examples of the first embodiment.

FIGS. 5A to 5D are diagrams illustrating waveforms of the first control signal, the second control signal, the drive voltage, and a drive current according to the first comparative example, respectively. The drive current is a current flowing between the first output terminal OUT1 of the H bridge circuit 11 and the second output terminal OUT2 of the H bridge circuit 11. In FIGS. 5A to 5D, the piezoelectric element P is used for a piezoelectric pump and the piezoelectric pump operates in a pressure mode. The pressure mode is a mode in which the piezoelectric pump is operated such that a suction port (or a discharge port) of the piezoelectric pump is closed and a pressure of the suction port (or the discharge port) of the piezoelectric pump is kept constant. In FIGS. 5A to 5D, a sample (see FIG. 11) is used as the piezoelectric pump. These points are similar in FIGS. 6A to 6D, FIGS. 7A to 7D, and FIGS. 8A to 8D.

The frequencies of the first control signal, the second control signal, the drive voltage, and the drive current are about 23.5 kHz (cycle is about 42.6 μs). Amplitudes of the first control signal and the second control signal are about 3 V. An amplitude of the drive voltage is about 24 V. The drive current increases instantaneously when the drive voltage transitions, in other words, when the drive voltage rises or falls. That is, a spike current flows through the first output terminal OUT1 when the drive voltage transitions. This spike current is caused by charging or discharging of a capacitor included in the piezoelectric element P. A ripple due to a $13^{th}$ order harmonic appears in (is superimposed on) the drive current. An amplitude of this ripple is about ½ times an amplitude of a fundamental wave.

FIGS. 6A to 6D are diagrams illustrating waveforms of the first control signal, the second control signal, the drive voltage, and a drive current according to the second comparative example, respectively. The waveforms of the first control signal, the second control signal, and the drive voltage are similar to those in the first comparative example. The drive current at the time of transition of the drive voltage is smaller than that in the first comparative example. This is because a high-frequency component of the drive current is suppressed by the inductor L1 (see FIG. 2), and in other words, steep change in the drive current is inhibited by the inductor L1. An amplitude of a ripple of the drive current is substantially equal to an amplitude of a fundamental wave. The amplitude of the ripple of the drive current is larger than that in the first comparative example.

A resonant frequency of resonance by the inductor L1 and an equivalent capacitor C1 (not illustrated) of the piezoelectric element P substantially coincides with a frequency of a $13^{th}$ order harmonic of the drive current. Thus, as compared with the case of the first comparative example, an impedance between the first output terminal OUT1 and the second output terminal OUT2 decreases at the frequency of the $13^{th}$ order harmonic of the drive current. As a result, since an amplitude of the $13^{th}$ order harmonic of the drive current increases, the amplitude of the ripple of the drive current is larger than that in the first comparative example.

FIGS. 7A to 7D are diagrams illustrating the waveforms of the first control signal, the second control signal, the drive voltage, and a drive current according to the first example of the first embodiment, respectively. Frequencies of the first control signal, the second control signal, the drive voltage, and the drive current are about 23.5 kHz (cycle is about 42.6 μs). Amplitudes of the first control signal and the second control signal are about 3 V. An amplitude of the drive voltage is about 24 V. In the first control signal, the second control signal, and the drive voltage, n=6, i.e. $T_{2n+1}=T_{13}=T_1/13$ is satisfied (see FIG. 3).

The drive current increases instantaneously every time the drive voltage transitions. The drive current at the time of the transition of the drive voltage is smaller than that in the first comparative example. This is because the potential difference between the potentials by each transition of the drive voltage is smaller than that in the first comparative example. Further, no ripple appears in the drive current. This is because the pause time of $T_1/13$ per cycle is provided to the drive voltage, so that the $13^{th}$ order harmonic contained in the drive current is suppressed. Details regarding this point will be described later.

Figure 9:
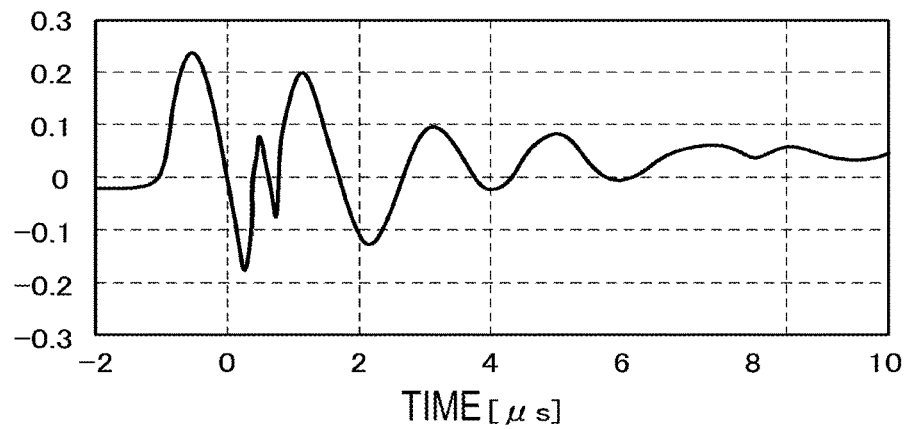
FIG. 9 is a diagram illustrating ringing of the drive current according to the second example of the first embodiment.
Figure 10:
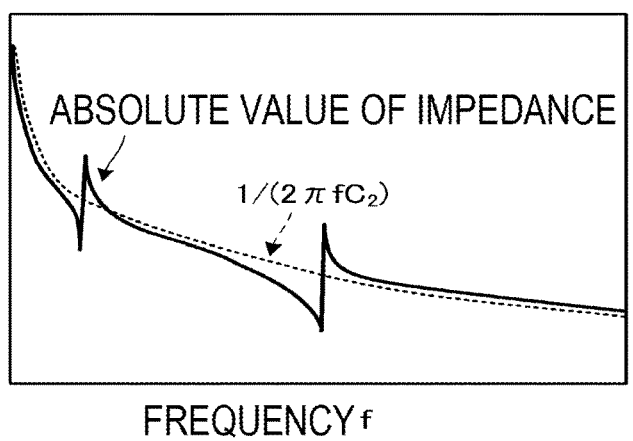
FIG. 10 is a schematic diagram illustrating frequency characteristics of an absolute value of an impedance of a piezoelectric element P.

FIGS. 8A to 8D are diagrams illustrating the waveforms of the first control signal, the second control signal, the drive voltage, and a drive current according to the second example of the first embodiment, respectively. FIG. 9 is a diagram illustrating ringing of the drive current according to the second example of the first embodiment. FIG. 10 is a schematic diagram illustrating frequency characteristics of an absolute value of an impedance of the piezoelectric element P. In FIG. 9, a sample 2 (see FIG. 11) is used as a piezoelectric pump. The vertical axis of FIG. 10 is a logarithmic scale.

The waveforms of the first control signal, the second control signal, and the drive voltage are similar to those in the first example of the first embodiment. The drive current at the time of the transition of the drive voltage is smaller than those in the second comparison example and the first example of the first embodiment. This is because the potential difference between the potentials by each transition of the drive voltage is smaller than that in the second comparative example, and a high-frequency component of the drive current is suppressed by the inductor L1 (see FIG. 2). Further, since the $13^{th}$ order harmonic of the drive current is suppressed, no ripple appears in the drive current.

On the other hand, resonance by the inductor L1 and an equivalent capacitor C2 (not illustrated) of the piezoelectric element P occurs in the drive current, so that ringing as damping oscillation from the time of the transition of the drive voltage appears therein. A frequency of the ringing of the drive current is about 490 kHz. As illustrated in FIG. 10, the capacitor C2 defines global frequency characteristics of the absolute value of the impedance of the piezoelectric element P. That is, the global frequency characteristics of the absolute value of the impedance of the piezoelectric element P are represented by $1/(2\pi f C_2)$, where f is the frequency and $C_2$ is a value of the capacitor C2. Note that the capacitor C2 is different from the capacitor C1 described above.

Figure 11:
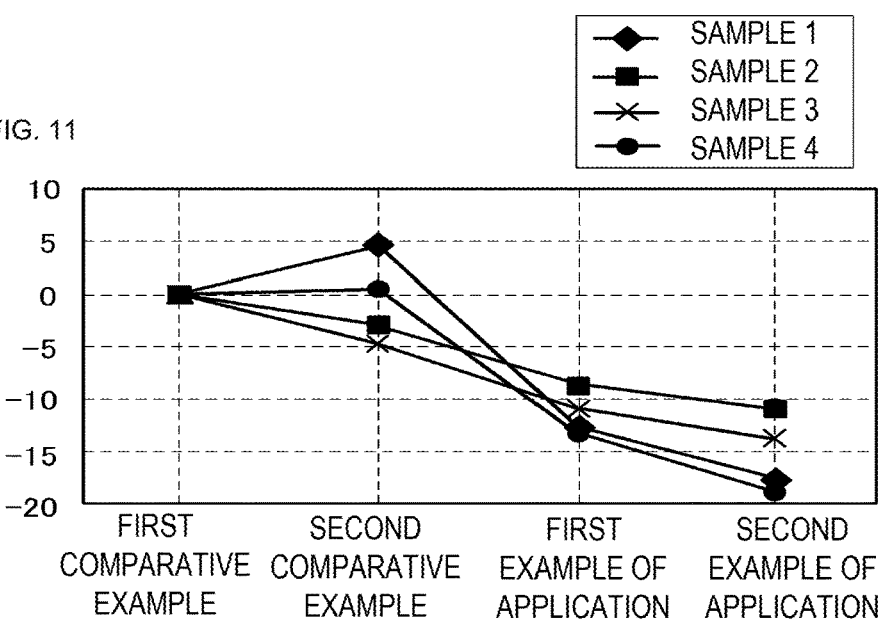
FIG. 11 is a diagram illustrating power consumption in a pressure mode according to the first embodiment.

FIG. 11 is a diagram illustrating power consumption in the pressure mode according to the first embodiment. Here, the power consumption is power consumed when the piezoelectric pump using the piezoelectric element P (see FIG. 1 or FIG. 2) is driven. In FIG. 11, the power consumption is represented as a ratio relative to the power consumption in the first comparative example. In FIG. 11, the power consumption of four types of piezoelectric pumps is illustrated. In the second comparative example, the power consumption is reduced as compared with the first comparative example in some samples and the power consumption is increased in other samples. In the first example of the first embodiment, the power consumption is reduced by about 10% as compared with the first comparative example. In the second example of the first embodiment, although there are some variations depending on the samples as compared with the first comparative example, the power consumption is reduced by about 15%.

While the spike current and ripple described above do not contribute to the operation of the piezoelectric pump, they increase the power consumption in the operation of the piezoelectric pump. In the second comparative example, as compared with the first comparative example, the spike current is suppressed but the ripple increases. Therefore, in the second comparative example, there are samples with which the power consumption increases and other samples with which the power consumption decreases as compared with the first comparative example. In the case of the sample 1, since influence by the increase in the ripple on the power consumption is larger than that by the decrease in the spike current, the power consumption in the second comparative example increases largely as compared with that in the first comparative example.

In the first example of the first embodiment, the spike current is suppressed to some extent as compared with that in the first comparative example, and no ripple appears in the drive current. Therefore, in the first example of the first embodiment, the power consumption is reduced as compared with the first comparative example and the second comparative example. In the second example of the first embodiment, the spike current is suppressed as compared with the first example of the first embodiment and no ripple appears in the drive current. Also, the ringing attenuates over time and therefore does not significantly affect the power consumption. Therefore, in the second example of the first embodiment, the power consumption is further reduced as compared with the first example of the first embodiment. In the second comparative example, it is not always possible to obtain the effect of reducing power in all of the samples in comparison with the first comparative example. In the second example of the first embodiment, the effect of reducing power is obtained in all of the samples in comparison with the first example of the first embodiment. Therefore, the effect of reducing power in the second example of the first embodiment is a synergistic effect.

Next, a reason why the ripple appears in the drive current in the first comparative example and the second comparative example, but no ripple appears in the drive current in the first and second examples of the first embodiment will be described. The drive current in each of the first comparative example and the first example of the first embodiment is obtained by dividing the drive voltage by the impedance of the piezoelectric element P (see FIG. 1). The drive current in each of the second comparative example and the second example of the first embodiment is obtained by dividing the drive voltage by the impedance between the first output terminal OUT1 and the second output terminal OUT2 (see FIG. 2).

Figure 12A:
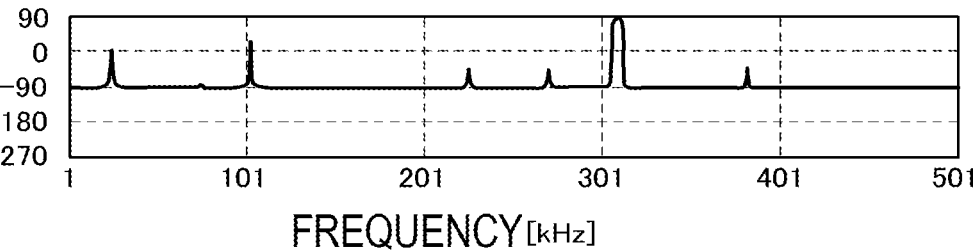
FIG. 12A is a diagram illustrating frequency characteristics of a phase of the impedance of the piezoelectric element P provided in a piezoelectric pump.
Figure 12B:
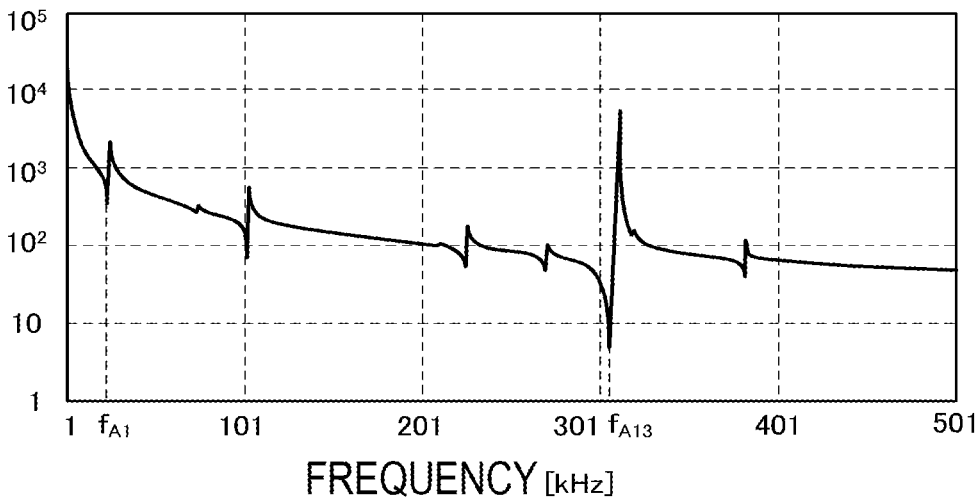
FIG. 12B is a diagram illustrating frequency characteristics of the absolute value of the impedance of the piezoelectric element P provided in the piezoelectric pump.

FIG. 12A is a diagram illustrating frequency characteristics of a phase of the impedance of the piezoelectric element P provided in the piezoelectric pump. FIG. 12B is a diagram illustrating frequency characteristics of the absolute value of the impedance of the piezoelectric element P provided in the piezoelectric pump. In FIGS. 12A and 12B, a sample 5 is used as the piezoelectric pump. The absolute value of the impedance of the piezoelectric element P has peaks in a negative direction due to resonance and peaks in a positive direction due to anti-resonance. The absolute value of the impedance of the piezoelectric element P attenuates in inverse proportion to the frequency except for the vicinities of the resonant frequencies and the anti-resonant frequencies. The phase of the impedance of the piezoelectric element P changes steeply at the resonant frequencies and the anti-resonant frequencies. The phase of the impedance of the piezoelectric element P is −90 degrees except for the vicinities of the resonant frequencies and the anti-resonant frequencies. The fundamental resonant frequency $f_{A1}$ of the piezoelectric element P is about 23.5 kHz. The absolute value of the impedance of the piezoelectric element P at the fundamental resonant frequency $f_{A1}$ is about 200Ω. The 13$^{th}$ order resonant frequency $f_{A13}$ of the piezoelectric element P is about 306 kHz. The absolute value of the impedance of the piezoelectric element P at the 13$^{th}$ order resonant frequency $f_{A13}$ is about 2Ω. The absolute value of the impedance of the piezoelectric element P has a peak having the highest height at a frequency of around 13 times the fundamental resonant frequency $f_{A1}$ of the piezoelectric element P, that is, the 13$^{th}$ order resonant frequency $f_{A13}$, among equal to or higher than the secondary resonance frequencies of the piezoelectric element P. The absolute value of the impedance of the piezoelectric element P at the 13$^{th}$ order resonant frequency $f_{A13}$ is about 1/100 of the absolute value of the impedance at the fundamental resonant frequency $f_{A1}$. The peak of the absolute value of the impedance of the piezoelectric element P at the 13$^{th}$ order resonant frequency $f_{A13}$ is higher than the peak of the absolute value of the impedance of the piezoelectric element P at the fundamental resonant frequency $f_{A1}$. The peak of the absolute value of the impedance of the piezoelectric element P at the 13$^{th}$ order resonant frequency $f_{A13}$ is the highest among the peaks of the absolute values of the impedances of the piezoelectric element P at the resonant frequencies of the piezoelectric element P.

Figure 13:
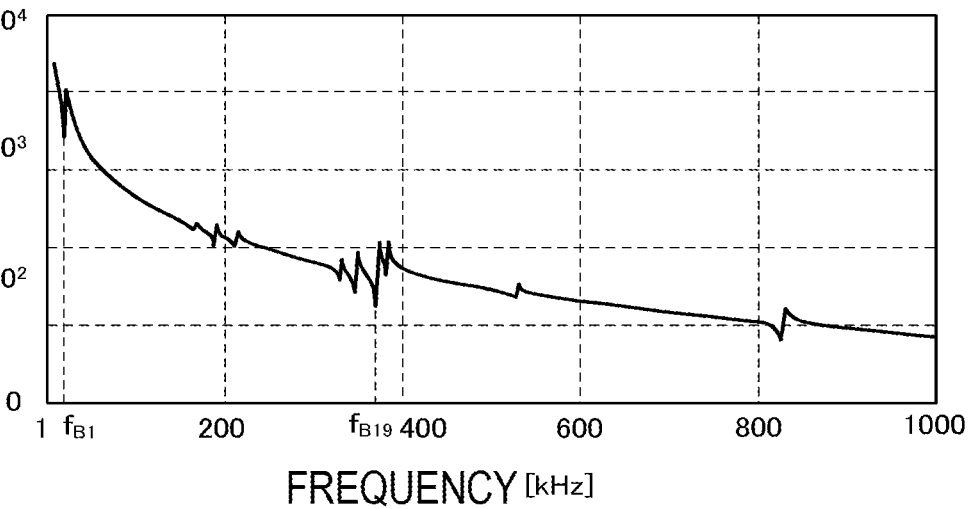
FIG. 13 is a diagram illustrating frequency characteristics of the absolute value of the impedance of the piezoelectric element P provided in the piezoelectric pump.
Figure 14A:
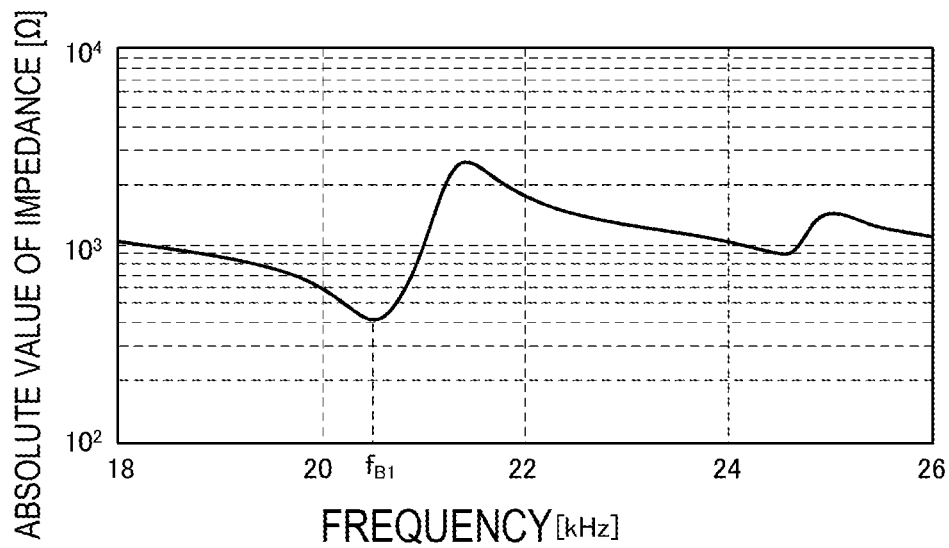
FIG. 14A is a diagram illustrating the vicinity of a fundamental resonant frequency of FIG. 13.
Figure 14B:
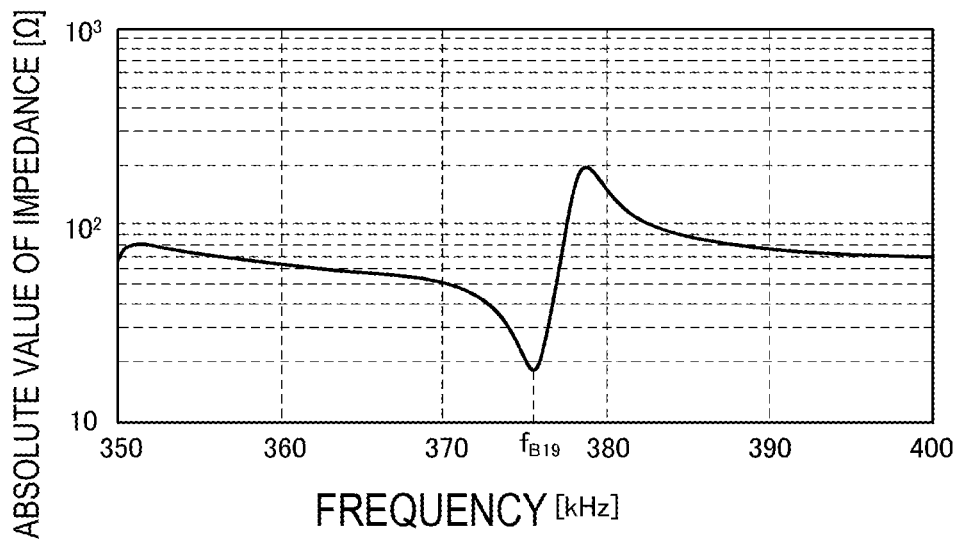
FIG. 14B is a diagram illustrating the vicinity of a $19^{th}$ order resonant frequency of FIG. 13.

FIG. 13 is a diagram illustrating frequency characteristics of the absolute value of the impedance of the piezoelectric element P provided in the piezoelectric pump. FIG. 14A is a diagram illustrating the vicinity of a fundamental resonant frequency of FIG. 13. FIG. 14B is a diagram illustrating the vicinity of a 19$^{th}$ order resonant frequency of FIG. 13. In FIG. 13, a sample 6 is used as the piezoelectric pump. The fundamental resonant frequency $f_{B1}$ of the piezoelectric element P is about 20.5 kHz. The absolute value of the impedance of the piezoelectric element P at the fundamental resonant frequency $f_{B1}$ is about 400Ω. The absolute value of the impedance of the piezoelectric element P at the 19$^{th}$ order resonant frequency $f_{B19}$ is about 20Ω. The absolute value of the impedance at the 19$^{th}$ order resonant frequency $f_{B19}$ is about 1/20 of the absolute value of the impedance at the fundamental resonant frequency $f_{B1}$.

The drive voltages in the first comparative example and the second comparative example are rectangular waves. The rectangular wave g(t) is expressed as in Equation (1), and is subjected to Fourier series expansion as in Equation (2).

Figure 15A:
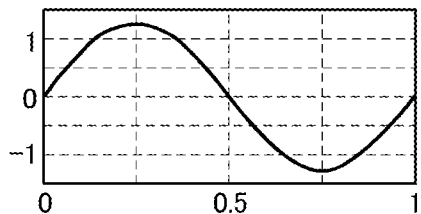
FIGS. 15A to 15F illustrate Fourier series expansion of a rectangular wave.
Figure 15B:
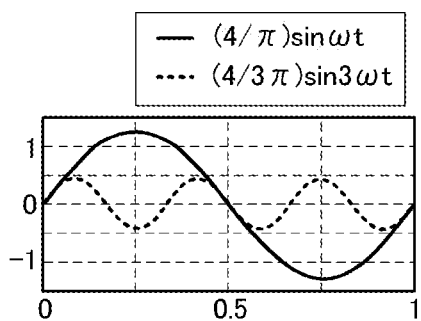
Figure 15C:
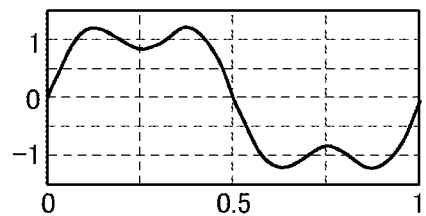
Figure 15D:
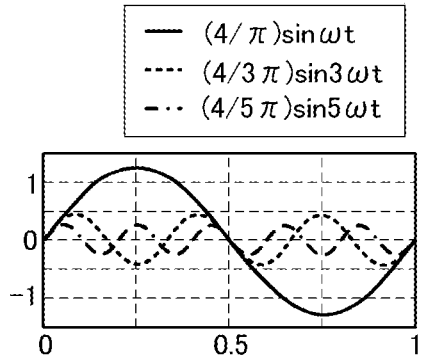
Figure 15E:
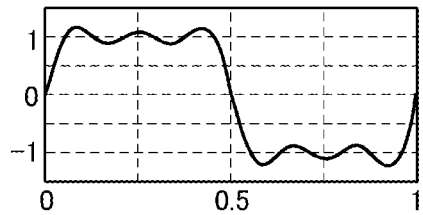
Figure 15F:
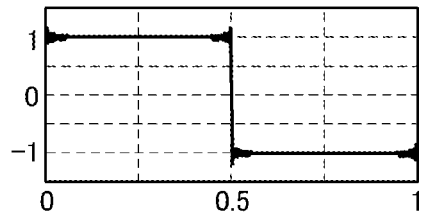

[Equation 1]

$$g(t) = \begin{cases} -1, & \left(k - \frac{1}{2}\right)T < t < kT \\ 1, & kT < t < \left(k + \frac{1}{2}\right)T \end{cases} \quad (1)$$

$$g(t) = \frac{4}{\pi}\left(\sin \omega t + \frac{1}{3}\sin 3\omega t + \frac{1}{5}\sin 5\omega t + \frac{1}{7}\sin 7\omega t + \ldots\right) \quad (2)$$

Where k is an integer, T is a cycle, and ω=2π/T is an angular frequency. FIG. 15A illustrates a waveform of a first-order term of Equation (2). FIG. 15B illustrates waveforms of the first and second-order terms of Equation (2). FIG. 15C illustrates a waveform of the sum of the first and second-order terms of Equation (2). FIG. 15D illustrates waveforms of the first to third-order terms of Equation (2). FIG. 15E illustrates a waveform of the sum of the first to third-order terms of Equation (2). FIG. 15F illustrates a waveform of the sum of first to sixtieth order terms of Equation (2). In FIGS. 15A to 15F, the cycle T=1 is set. Thus, the rectangular wave is represented by superposition of the fundamental wave and odd-numbered order harmonics.

In the first comparative example and the second comparative example, q is a natural number, the drive voltage contains a $(2q+1)^{th}$ order harmonic, and an amplitude of the $(2q+1)^{th}$ order harmonic of the drive voltage is $1/(2q+1)$ of the amplitude of the fundamental wave. As described above, the frequencies of the first control signal and the second control signal are substantially equal to the fundamental resonant frequency of the piezoelectric element P. Therefore, the frequency of the drive voltage is substantially equal to the fundamental resonant frequency of the piezoelectric element P. The frequency of the $(2q+1)^{th}$ order harmonic of the drive voltage is substantially equal to the $(2q+1)^{th}$ order resonant frequency of the piezoelectric element P.

Therefore, in the first comparative example, the amplitude of the $(2q+1)^{th}$ order harmonic of the drive current is about $|Z_1|/[(2q+1)|Z_{2q+1}|]$ times the amplitude of the fundamental wave of the drive current. Here, $Z_1$ is an impedance of the piezoelectric element P at the fundamental resonant frequency of the piezoelectric element P. $Z_{2q+1}$ is an impedance of the piezoelectric element P at the $(2q+1)^{th}$ order resonant frequency of the piezoelectric element P. When the absolute value $|Z_{2q+1}|$ of the impedance of the piezoelectric element P becomes about $|Z_1|/(2q+1)$, the amplitude of the $(2q+1)^{th}$ order harmonic of the drive current becomes substantially equal to the amplitude of the fundamental wave of the drive current. The amplitude of the $(2q+1)^{th}$ order harmonic of the drive current increases as the absolute value $|Z_{2q+1}|$ of the impedance of the piezoelectric element P decreases. As described above, the absolute value of the impedance of the piezoelectric element P has a peak having the highest height at the $(2n+1)^{th}$ order resonant frequency of the piezoelectric element P among the equal to or higher than secondary resonant frequencies of the piezoelectric element P. Therefore, in the first comparative example, since the $(2n+1)^{th}$ order harmonic is mainly contained in the harmonics included in the drive current, a ripple due to the $(2n+1)^{th}$ order harmonic appears in the drive current.

In the second comparative example, the inductor L1 (see FIG. 2) is provided in the piezoelectric element drive circuit, but even in the second comparative example, the ripple due to the $(2n+1)^{th}$ order harmonic appears in the drive current with substantially the same principle as that in the first comparative example. The amplitude of the $(2q+1)^{th}$ order harmonic of the drive current is about $|Z_{S1}|/[(2q+1)|Z_{S2q+1}|]$ times the amplitude of the fundamental wave of the drive current. Here, $Z_{S1}$ is an impedance between the first output terminal OUT1 and the second output terminal OUT2 at the fundamental resonant frequency of the piezoelectric element P. $Z_{S2q+1}$ is an impedance between the first output terminal OUT1 and the second output terminal OUT2 at the $(2q+1)^{th}$ order resonant frequency of the piezoelectric element P.

In the first and second examples of the first embodiment, the drive voltage is the step wave as illustrated in FIG. 3. The step wave s(t) is expressed as in Equation (3), and a $(2j+1)^{th}$ order harmonic $s_h(t)$ contained in the step wave s(t) is expressed as in Equation (4) by the Fourier series expansion.

[Equation 2]

$$s(t) = \begin{cases} 0, & \left(k - \frac{1}{2}\right)T < t < \left(k - \frac{1}{2} + \frac{1}{2(2j+1)}\right)T \\ -1, & \left(k - \frac{1}{2} + \frac{1}{2(2j+1)}\right)T < t < kT \\ 0, & kT < t < \left(k + \frac{1}{2(2j+1)}\right)T \\ 1, & \left(k + \frac{1}{2(2j+1)}\right) < t < \left(k + \frac{1}{2}\right)T \end{cases} \quad (3)$$

$$s_h(t) = a_{2j+1}\cos(2j+1)\omega t + b_{2j+1}\sin(2j+1)\omega t \quad (4)$$

$$a_{2j+1} = \frac{2}{T}\int_{-T/2}^{T/2} s(t)\cos(2j+1)\omega t\, dt \quad (5)$$

$$b_{2j+1} = \frac{2}{T}\int_{-T/2}^{T/2} s(t)\sin(2j+1)\omega t\, dt \quad (6)$$

Where j is a natural number, k is an integer, T is a cycle, and ω=2 π/T is an angular frequency. Calculation of the right sides of Equation (5) and Equation (6) provides $s_h(t)=0$. As can be seen from this result, in the first and second examples of the first embodiment, the drive voltage does not contain the $(2n+1)^{th}$ order harmonic. Therefore, since the drive current does not contain the $(2n+1)^{th}$ order harmonic, no ripple due to the $(2n+1)^{th}$ order harmonic appears in the drive current.

As described above, the spike current and ripple increase the wasteful power consumption that does not contribute to the substantial operation of the piezoelectric pump. In the first comparative example and the second comparative example, the ripple due to the $(2n+1)^{th}$ order harmonic appears in the drive current while reflecting the frequency characteristics of the impedance of the piezoelectric element P. In the first example of the first embodiment, the pause time of the drive voltage is $T_{2n+1}=T^1/(2n+1)$ per cycle. As a result, since the $(2n+1)^{th}$ order harmonic of the drive current is suppressed, the ripple due to the $(2n+1)^{th}$ order harmonic does not appear in the drive current. Therefore, in the first example of the first embodiment, it is possible to reduce the wasteful power consumption that does not contribute to the substantial operation of the piezoelectric element P as compared with the first comparative example and the second comparative example.

In the second example of the first embodiment, the inductor L1 is provided. As a result, the high frequency component contained in the drive current is removed, so that the spike current which is generated in the transition of the drive voltage is suppressed. Further, even if resonance by the inductor L1 and the equivalent capacitor C1 of the piezoelectric element P occurs and the impedance between the first output terminal OUT1 and the second output terminal OUT2 is further decreased, as in the first example of the first embodiment, the $(2n+1)^{th}$ order harmonic of the drive current is suppressed. Therefore, no ripple due to the $(2n+1)^{th}$ order harmonic appears in the drive current. Accordingly, in the second example of the first embodiment, it is possible to further reduce the wasteful power consumption as compared with the first example of the first embodiment.

Although the inductor L1 is provided also in the second comparative example, power consumption is not necessarily reduced as compared with the first comparative example. Therefore, the effect of the piezoelectric element drive circuit in the second example of the first embodiment is the synergistic effect by the facts that the drive voltage is the step wave characterized by the pause time $T_{2n+1}$ and the inductor L1 is provided.

Second Embodiment

In a second embodiment, a period in which a drive voltage is a maximum value and a period in which the drive voltage is a minimum value are different from each other per cycle of the drive voltage. A first example of the second embodiment has a similar circuit configuration to that in the first example of the first embodiment (see FIG. 1). A second example of the second embodiment has a similar circuit configuration to that in the second example of the first embodiment (see FIG. 2).

Figure 16:
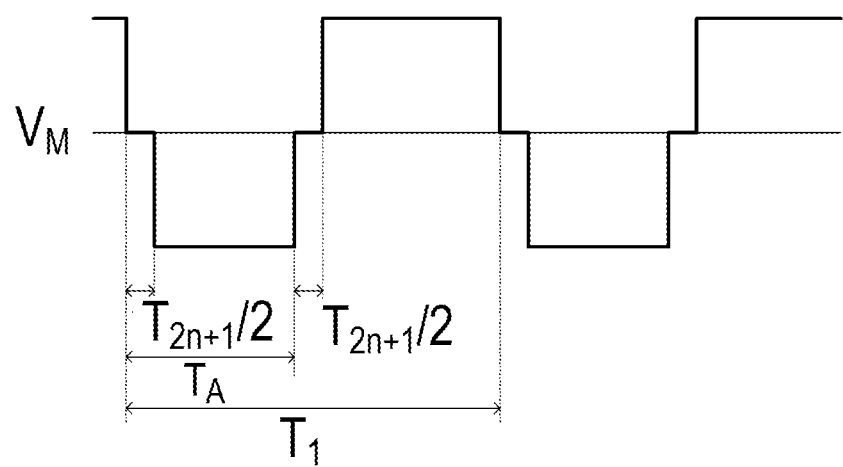
FIG. 16 is a schematic diagram illustrating a waveform of a drive voltage according to a second embodiment.
Figure 19A:
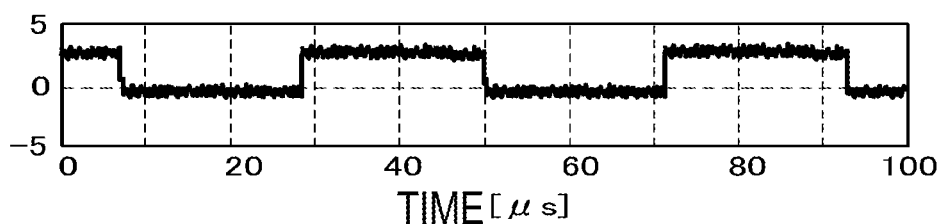
FIGS. 19A to 19D are diagrams illustrating waveforms of a first control signal, a second control signal, a drive voltage, and a drive current in a first example of the second embodiment, respectively.
Figure 19B:
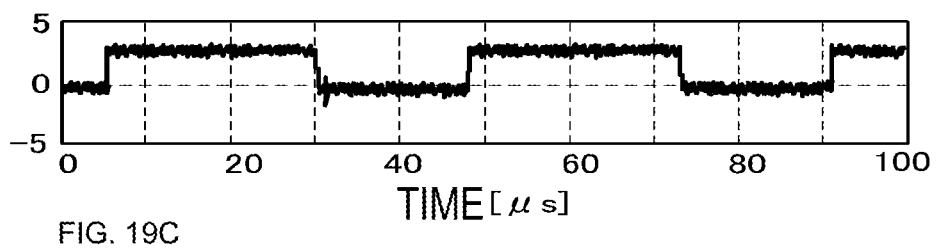
Figure 19C:
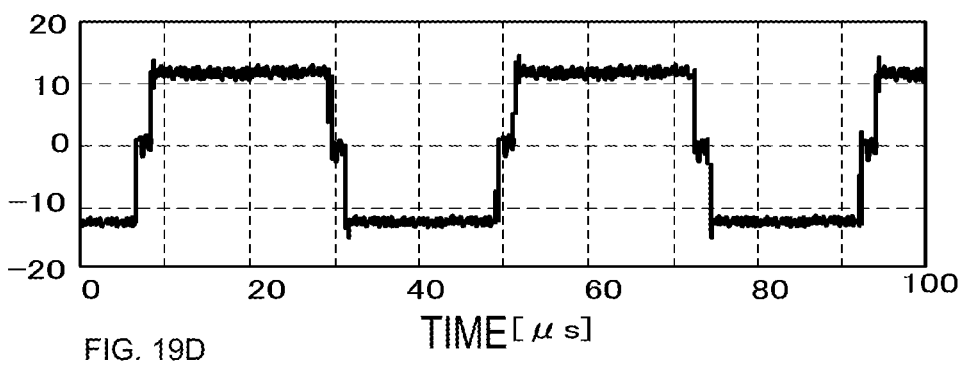
Figure 19D:
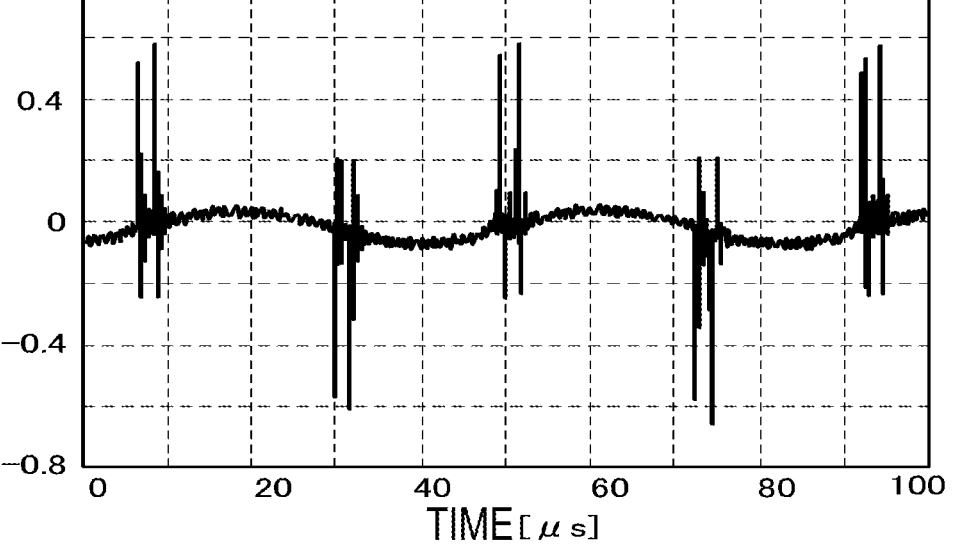

FIG. 16 is a schematic diagram illustrating waveforms of drive voltages according to the first and second examples of the second embodiment. A cycle of the drive voltage is $T_1$. The drive voltage is an intermediate potential for a period of time $T_{2n+1}/2$, is a minimum value for a subsequent period of time $T_A-T_{2n-1}/2$, is the intermediate potential for a subsequent period of time $T_{2n+1}/2$, and is a maximum value for a subsequent period of time $T_1-T_A-T_{2n+1}/2$. The drive voltage periodically repeats this step-like transition. The period of time $T_A$ has a value which is different from a period of time $T_1/2$.

FIGS. 17A to 17D are diagrams illustrating waveforms of a first control signal, a second control signal, a drive voltage, and a drive current in a first comparative example, respectively. In FIGS. 17A to 17D, the piezoelectric element P is used for a piezoelectric pump, and the piezoelectric pump is operated in a flow rate mode. The flow rate mode is a mode in which the piezoelectric pump is operated such that a suction port and a discharge port of the piezoelectric pump are made into open states and a flow rate of the suction port or the discharge port of the piezoelectric pump is constant. In FIGS. 17A to 17D, the sample 1 (see FIG. 11) is used as the piezoelectric pump. These points are similar in FIGS. 18A to 18D, FIGS. 19A to 19D, and FIGS. 20A to 20D. The waveforms of the first control signal, the second control signal, the drive voltage, and the drive current are similar to those in the case of the pressure mode (see FIGS. 5A to 5D).

FIGS. 18A to 18D are diagrams illustrating waveforms of a first control signal, a second control signal, a drive voltage, and a drive current in a second comparative example, respectively. The waveforms of the first control signal, the second control signal, the drive voltage, and the drive current are similar to those in the case of the pressure mode (see FIGS. 6A to 6D).

FIGS. 19A to 19D are diagrams illustrating waveforms of a first control signal, a second control signal, a drive voltage, and a drive current in the first example of the second embodiment. Frequencies of the first control signal, the second control signal, the drive voltage, and the drive current are about 23.5 kHz (cycle is about 42.6 μs). Amplitudes of the first control signal and the second control signal are about 3 V. An amplitude of the drive voltage is about 24 V. In the first control signal, the second control signal, and the drive voltage, the period of time $T_A$ is about 20 μs, n=6, i.e. $T_{2n+1}=T_{13}=T_1/13$ (see FIG. 16). The drive current increases instantaneously every time the drive voltage transitions. The drive current at the time of the transition of the drive voltage is smaller than that in the first comparative example. Further, no ripple appears in the drive current.

FIGS. 20A to 20D are diagrams illustrating waveforms of a first control signal, a second control signal, a drive voltage, and a drive current in the second example of the second embodiment. The waveforms of the first control signal, the second control signal, and the drive voltage are similar to those in the case of the first example of the second embodiment. The drive current at the time of the transition of the drive voltage is smaller than those in the second comparison example and the first example of the second embodiment. No ripple appears in the drive current. On the other hand, ringing as damping oscillation from the time of the transition of the drive voltage appears in the drive current.

Figure 21:
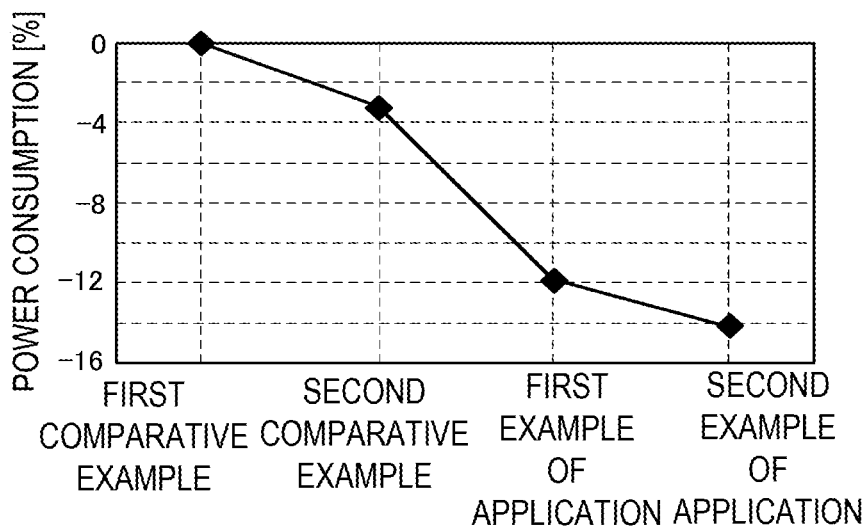
FIG. 21 is a diagram illustrating power consumption in a flow rate mode according to the second embodiment.

FIG. 21 is a diagram illustrating power consumption in the flow rate mode according to the second embodiment. In FIG. 21, the power consumption is represented as a ratio relative to the power consumption in the first comparative example. In FIG. 21, the sample 1 (see FIG. 11) is used as the piezoelectric pump. In the second comparative example, the power consumption is reduced by about 3%. In the first example of the second embodiment, the power consumption is reduced by about 12%. In the second example of the second embodiment, the power consumption is reduced by about 15%. In this way, in the first example of the second embodiment, an effect equivalent to that in the first example of the first embodiment is obtained. In the second example of the second embodiment, an effect equivalent to that in the second example of the first embodiment is obtained.

Third Embodiment

Figure 22:
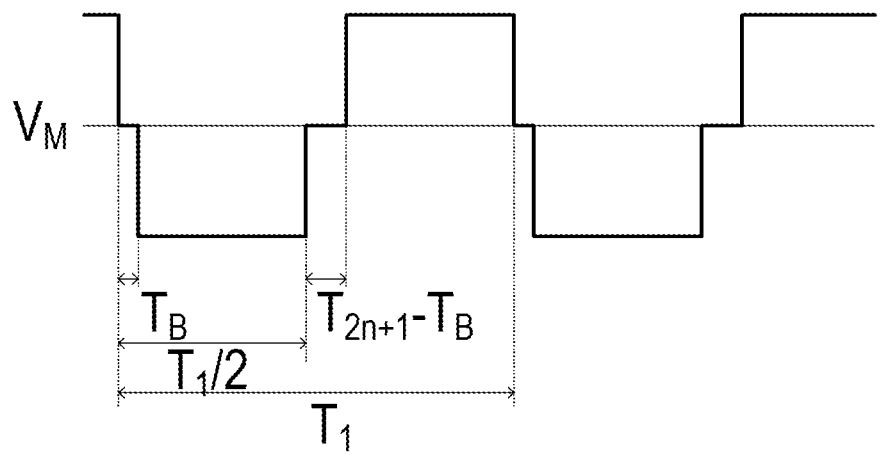
FIG. 22 is a schematic diagram illustrating a waveform of a drive voltage according to a first example of a third embodiment.

In a first example of a third embodiment, a period of time for which a drive voltage remains at an intermediate potential after the drive voltage falls to the intermediate potential and a period of time for which the drive voltage remains at the intermediate potential after the drive voltage rises to the intermediate potential are different from each other. FIG. 22 is a schematic diagram illustrating a waveform of the drive voltage according to the first example of the third embodiment. A cycle of the drive voltage is $T_1$. The drive voltage is the intermediate potential for a period of time $T_B$, is a minimum value for a subsequent period of time $T_1/2-T_B$, is the intermediate potential for a subsequent period of time $T_{2n+1}-T_B$, and is a maximum value for a subsequent period of time $T_1/2-(T_{2n+1}-T_B)$. The drive voltage periodically repeats this step-like transition. The period of time $T_B$ has a value which is different from time $T_{2n+1}/2$.

Figure 23:
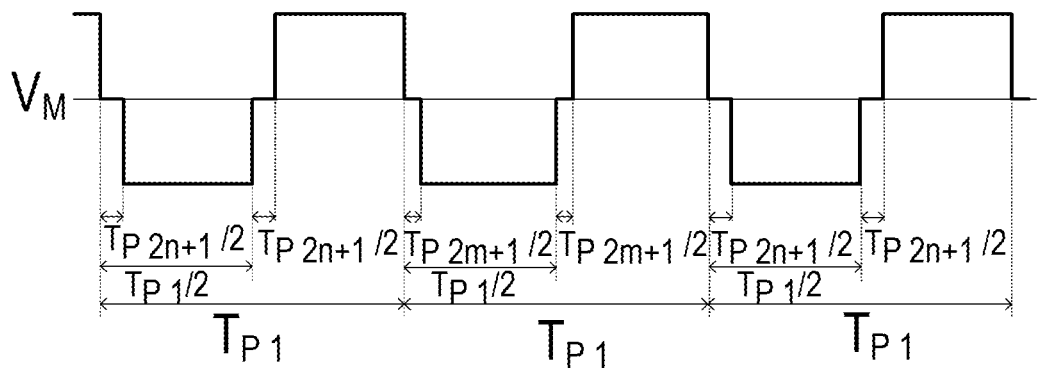
FIG. 23 is a schematic diagram illustrating a waveform of a drive voltage according to a second example of the third embodiment.

In a second example of the third embodiment, pause time of the drive voltage is different for each time length $T_{P1}$. Here, the time length $T_{P1}$ is a period of time from time when the drive voltage falls to the intermediate potential to time when the drive voltage falls to the intermediate potential subsequently, and is substantially equal to a reciprocal of a fundamental resonant frequency of the piezoelectric element P. FIG. 23 is a schematic diagram illustrating a waveform of the drive voltage according to the second example of the third embodiment. A cycle of the drive voltage is $2T_{P1}$. The drive voltage is the intermediate potential for a period of time $T_{P2n+1}/2$, is a minimum value for a subsequent period of time $(T_{P1}-T_{P2n+1})/2$, is the intermediate potential for a subsequent period of time $T_{P2n+1}/2$, and is a maximum value for a subsequent period of time $(T_{P1}-T_{P2n+1})/2$. The drive voltage is the intermediate potential for a subsequent period of time $T_{P2m+1}/2$, is the minimum value for a subsequent period of time $(T_{P1}-T_{P2m+1})/2$, is the intermediate potential for a subsequent period of time $T_{P2m+1}/2$, and is the maximum value for a subsequent period of time $(T_{P1}-T_{P2m+1})/2$. The drive voltage periodically repeats this step-like transition. Here, $T_{P2n+1}=T_{P1}/(2n+1)$ and $T_{P2m+1}=T_{P1}/(2m+1)$ are satisfied. n and m are natural numbers, and n and m are different from each other.

In addition, in the second example of the third embodiment, an example in which the pause time of the drive voltage is defined by two odd numbers 2n+1 and 2 m+1 has been described, but the pause time of the drive voltage may be defined by equal to or more than two odd numbers, or may be arbitrarily varied. When the absolute value of the impedance of the piezoelectric element P has a plurality of large peaks (strong responses), it is preferable that the pause time of the drive voltage be different for each time length $T_{P1}$.

Fourth Embodiment

Figure 24:
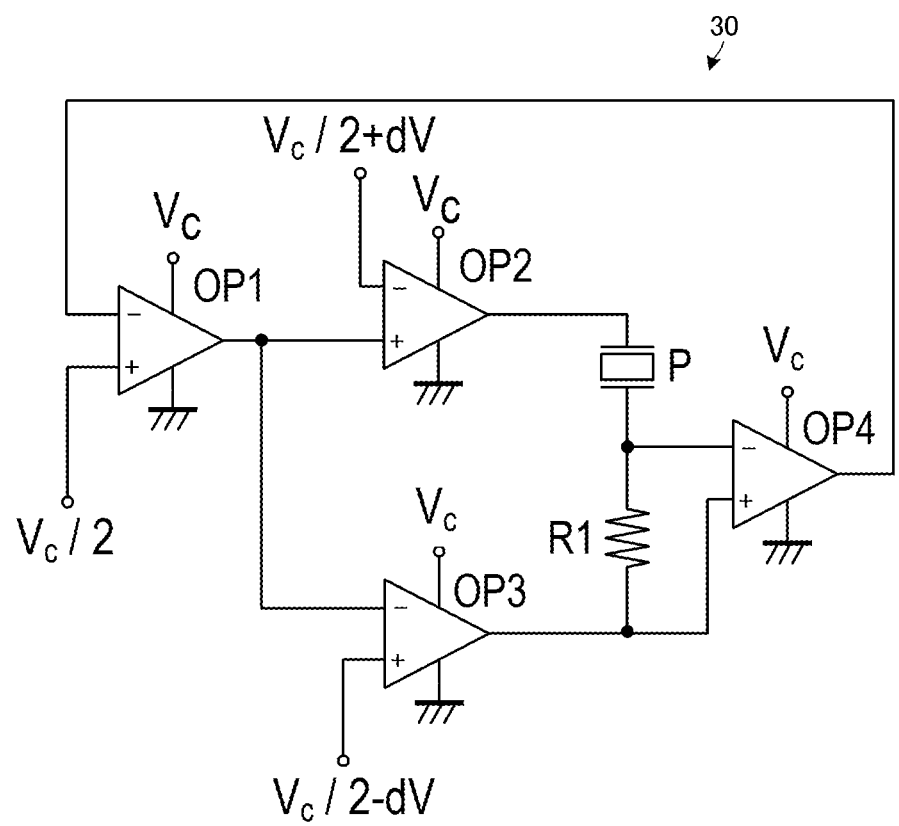
FIG. 24 is a circuit diagram of a piezoelectric element drive circuit 30 according to a fourth embodiment.

A piezoelectric element drive circuit according to a fourth embodiment is a self-excited oscillation circuit. FIG. 24 is a circuit diagram of a piezoelectric element drive circuit 30 according to the fourth embodiment. The piezoelectric element drive circuit 30 includes operational amplifiers OP1 to OP4 and a resistor R1. A circuit including the operational amplifiers OP1 to OP3 is an example of a "drive voltage generator" of the disclosure. A reference voltage Vc/2 is applied to a positive phase input terminal of the operational amplifier OP1. A reverse phase input terminal of the operational amplifier OP1 is connected to an output terminal of the operational amplifier OP4. An output terminal of the operational amplifier OP1 is connected to a positive phase input terminal of the operational amplifier OP2 and a reverse phase input terminal of the operational amplifier OP3. A reference voltage Vc/2+dV is applied to a reverse phase input terminal of the operational amplifier OP2. An output terminal of the operational amplifier OP2 is connected to a first terminal of the piezoelectric element P. A reference voltage Vc/2−dV is applied to a positive phase input terminal of the operational amplifier OP3. An output terminal of the operational amplifier OP3 is connected to a second terminal of the piezoelectric element P with the resistor R1 interposed therebetween. A positive phase input terminal and a reverse phase input terminal of the operational amplifier OP4 are connected to a first terminal and a second terminal of the resistor R1, respectively. Vc is applied to positive power supply terminals of the operational amplifiers OP1 to OP4. Negative power supply terminals of the operational amplifiers OP1 to OP4 are grounded. Characteristics of each circuit element of the piezoelectric element drive circuit 30 are determined so as to satisfy the Barkhausen oscillation condition at a fundamental resonant frequency of the piezoelectric element P. Therefore, the piezoelectric element drive circuit 30 drives the piezoelectric element P at the fundamental resonant frequency of the piezoelectric element P.

The operational amplifier OP4 detects a voltage proportional to a drive current and differentially amplifies the voltage. The operational amplifier OP1 amplifies the difference between an output signal of the operational amplifier OP4 and the reference voltage Vc/2. The operational amplifier OP1 is an inverting amplifier circuit. An output signal of the operational amplifier OP1 is a substantially trapezoidal wave. The operational amplifier OP2 amplifies the difference between the output signal of the operational amplifier OP1 and the reference voltage Vc/2+dV. The operational amplifier OP2 is a non-inverting amplifier circuit. The operational amplifier OP3 amplifies the difference between the output signal of the operational amplifier OP1 and the reference voltage Vc/2−dV. The operational amplifier OP3 is an inverting amplifier circuit. A period in which the output signal of the operational amplifier OP1 is equal to or higher than the reference voltage Vc/2+dV is different from a period in which the output signal of the operational amplifier OP1 is equal to or higher than the reference voltage Vc/2−dV. Therefore, the potential difference between the output terminal of the operational amplifier OP2 and the output terminal of the operational amplifier OP3 is a step wave which transitions in a substantially step-like manner while taking an intermediate potential (see FIG. 3). In the fourth embodiment, similar effects to those in the first embodiment are obtained.

Figure 25A:
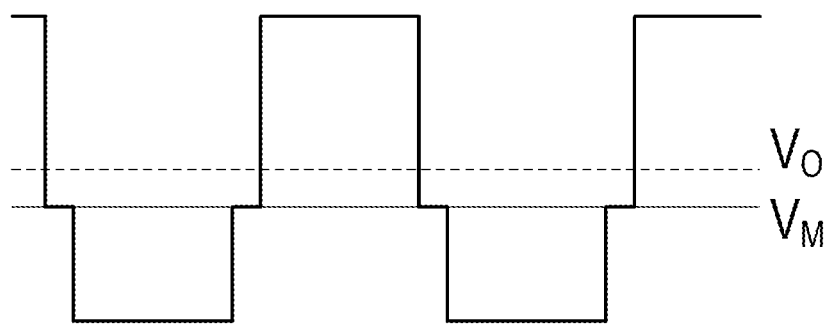
FIGS. 25A and 25B are schematic diagrams illustrating a waveform of a drive voltage according to another embodiment.
Figure 25B:
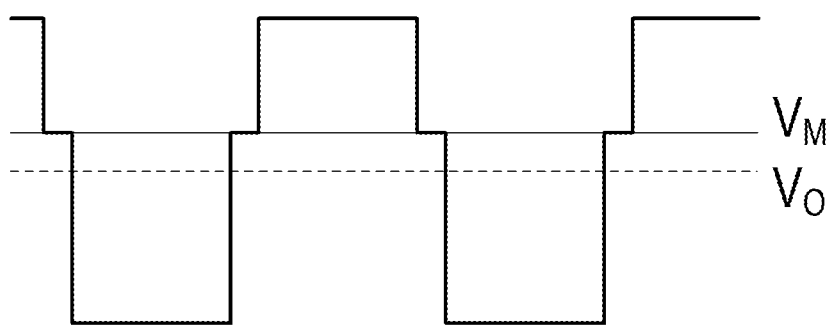

Although in the above embodiments, the intermediate potential of the drive voltage is set to the median value of the maximum value of the drive voltage and the minimum value of the drive voltage, as an example, the intermediate potential may be set to a value closer to the minimum value than the median value or a value closer to the maximum value than the median value. FIG. 25A illustrates a waveform of a drive voltage an intermediate potential $V_M$ of which is a value closer to a minimum value than a median value $V_0$. FIG. 25B illustrates a waveform of a drive voltage the intermediate potential $V_M$ of which is a value closer to a maximum value than the median value $V_0$.

In addition, although in the above embodiments, there is one potential to which the drive voltage transitions between the maximum value and the minimum value, as an example, a plurality of potentials to which the drive voltage transitions may exist between the maximum value and the minimum value. That is, the drive voltage may transition to the maximum value, the minimum value, and the plurality of intermediate potentials.

In addition, although the inductor is provided as an example in the above embodiments, another element or circuit that can remove a high-frequency component of a drive current may be provided.

Further, in the above embodiments, the odd number 2n+1 defining the drive voltage is determined from the peak having the highest height among the peaks of the absolute values of the impedances of the piezoelectric element, as an example, but the odd number 2n+1 may be determined from another peak of the absolute value of the impedance of the piezoelectric element.

IN1 FIRST INPUT TERMINAL
IN2 SECOND INPUT TERMINAL
L1 INDUCTOR
OP1 TO OP4 OPERATIONAL AMPLIFIER
OUT1 FIRST OUTPUT TERMINAL
OUT2 SECOND OUTPUT TERMINAL
P PIEZOELECTRIC ELEMENT
R1 RESISTOR
10, 20, 30 PIEZOELECTRIC ELEMENT DRIVE CIRCUIT (DRIVE VOLTAGE GENERATOR)
11 BRIDGE CIRCUIT
12 CONTROL SIGNAL GENERATOR

The invention claimed is:

1. A piezoelectric element drive circuit comprising:
   a piezoelectric element configured to be driven at a predetermined frequency and that has a resonant frequency of (2n+1) times the predetermined frequency, wherein n is a predetermined natural number; and
   a drive voltage generator circuit that has a first output connected to a first terminal of the piezoelectric element and a second output connected to a second terminal of the piezoelectric element,
   wherein a waveform of a potential difference between the first output terminal and the second output terminal is a step wave that transitions through an intermediate potential, and
   the potential difference is the intermediate potential for a time length of (t2−t1)/(2n+1), wherein (t2−t1) is one period of the step wave.

2. The piezoelectric element drive circuit according to claim 1, wherein a maximum of an absolute value of an impedance of the piezoelectric element at the resonant frequency is greater than a maximum of an absolute value of an impedance of the piezoelectric element at the predetermined frequency.

3. The piezoelectric element drive circuit according to claim 1,
   wherein a maximum of an absolute value of an impedance of the piezoelectric element at the resonant frequency is greater than maximums of absolute values of impedances of the piezoelectric element at other resonant frequencies of the piezoelectric element.

4. The piezoelectric element drive circuit according to claim 1, further comprising a control signal generator circuit that has a first control signal output and a second control signal output,
   wherein the drive voltage generator circuit has a first input connected to the first control signal output and a second input connected to the second control signal output.

5. The piezoelectric element drive circuit according to claim 1, further comprising an inductor that is connected in series between the first output of the drive voltage generator circuit and the first terminal of the piezoelectric element.

6. The piezoelectric element drive circuit according to claim 4, further comprising an inductor that is connected in series between the first output of the drive voltage generator circuit and the first terminal of the piezoelectric element.

7. The piezoelectric element drive circuit according to claim 1, wherein when the potential difference is the intermediate potential, the first output terminal and the second output terminal are in open states as viewed from the piezoelectric element.

8. The piezoelectric element drive circuit according to claim 4, wherein when the potential difference is the intermediate potential, the first output terminal and the second output terminal are in open states as viewed from the piezoelectric element.

9. The piezoelectric element drive circuit according to claim 5, wherein when the potential difference is the intermediate potential, the first output terminal and the second output terminal are in open states as viewed from the piezoelectric element.

10. The piezoelectric element drive circuit according to claim 1, wherein the intermediate potential is 0 V.

11. The piezoelectric element drive circuit according to claim 4, wherein the intermediate potential is 0 V.

12. The piezoelectric element drive circuit according to claim 5, wherein the intermediate potential is 0 V.

13. The piezoelectric element drive circuit according to claim 7, wherein the intermediate potential is 0 V.

* * * * *